(12) United States Patent
Michiue et al.

(10) Patent No.: US 7,668,218 B2
(45) Date of Patent: Feb. 23, 2010

(54) NITRIDE SEMICONDUCTOR LASER ELEMENT

(75) Inventors: Atsuo Michiue, Komatsushima (JP); Tomonori Morizumi, Anan (JP); Hiroaki Takahashi, Anan (JP)

(73) Assignee: Nichia Corporation, Anan-shi (JP)

( * ) Notice: Subject to any disclaimer, the term of this patent is extended or adjusted under 35 U.S.C. 154(b) by 22 days.

(21) Appl. No.: 12/033,378

(22) Filed: Feb. 19, 2008

(65) Prior Publication Data

US 2008/0198886 A1 Aug. 21, 2008

(30) Foreign Application Priority Data

Feb. 20, 2007 (JP) ............................. 2007-039271
Feb. 28, 2007 (JP) ............................. 2007-050554
Mar. 9, 2007 (JP) ............................. 2007-060594

(51) Int. Cl.
*H01S 5/00* (2006.01)

(52) U.S. Cl. .............................. 372/44.011; 372/43.01; 372/49.01; 372/98; 372/99

(58) Field of Classification Search .............. 372/43.01, 372/44.011, 49.01, 98, 99
See application file for complete search history.

(56) References Cited

U.S. PATENT DOCUMENTS

| 7,057,211 | B2 | 6/2006 | Dwilinski et al. | |
|---|---|---|---|---|
| 7,315,559 | B2 | 1/2008 | Dwilinski et al. | |
| 2002/0094002 | A1* | 7/2002 | Amano et al. ................. | 372/45 |
| 2003/0091079 | A1* | 5/2003 | Yokota .......................... | 372/44 |
| 2003/0128729 | A1* | 7/2003 | Matsumura .................... | 372/46 |
| 2005/0059181 | A1 | 3/2005 | Yamane et al. | |
| 2007/0025231 | A1 | 2/2007 | Ochiai et al. | |
| 2007/0054431 | A1 | 3/2007 | Kamikawa et al. | |
| 2007/0080368 | A1 | 4/2007 | Kamikawa et al. | |
| 2007/0147448 | A1 | 6/2007 | Bessho et al. | |
| 2007/0205424 | A1 | 9/2007 | Kamikawa et al. | |
| 2007/0210324 | A1 | 9/2007 | Kawaguchi et al. | |
| 2007/0298528 | A1 | 12/2007 | Yamane et al. | |

FOREIGN PATENT DOCUMENTS

| JP | S63-164286 A | 7/1988 |
|---|---|---|
| JP | H04-079279 A | 3/1992 |
| JP | H09-162496 A | 6/1997 |
| JP | H09-162497 A | 6/1997 |
| JP | H09-283843 A | 10/1997 |
| JP | H10-070338 A | 3/1998 |
| JP | 2002-100830 A | 4/2002 |
| JP | 2002-329926 A | 11/2002 |

(Continued)

*Primary Examiner*—Minsun Harvey
*Assistant Examiner*—Xnning Niu
(74) *Attorney, Agent, or Firm*—Global IP Counselors, LLP

(57) ABSTRACT

The present invention provides a nitride semiconductor laser element, comprising: a nitride semiconductor structure having a first nitride semiconductor layer, a second nitride semiconductor layer, and an active layer provided between the first and second nitride semiconductor layers; a cavity end face provided to the nitride semiconductor structure; and a protective film having a hexagonal crystal structure, and having a first region provided on a first crystal surface of the nitride semiconductor structure in the cavity end face and a second region provided on a second crystal surface in the surface of at least one of the first and second nitride semiconductor layer, the first and second regions of the protective film are oriented in the same axial direction as that of the respective first and second crystal surfaces.

24 Claims, 14 Drawing Sheets

FOREIGN PATENT DOCUMENTS

| | | |
|---|---|---|
| JP | 2002-335053 A | 11/2002 |
| JP | 2004-327637 A | 11/2004 |
| JP | 2005-079406 A | 3/2005 |
| JP | 2005-101457 A | 4/2005 |
| JP | 2006-228892 A | 8/2006 |
| JP | 2007-059732 A | 3/2007 |
| JP | 2007-103814 A | 4/2007 |
| JP | 2007-150004 A | 6/2007 |
| JP | 2007-201412 A | 8/2007 |
| JP | 2007-273951 A | 10/2007 |
| JP | 2007-273953 A | 10/2007 |
| WO | WO-03/036771 A1 | 5/2003 |

* cited by examiner

NITRIDE SEMICONDUCTOR LASER ELEMENT

BACKGROUND OF THE INVENTION

1. Field of the Invention

The present invention relates to a nitride semiconductor laser element and more particularly relates to a nitride semiconductor laser element having a protective film with cavity end faces.

2. Background Information

With a nitride semiconductor laser element, there is a concern that the cavity end faces formed by cleavage or RIE (reactive ion etching) will have a lower band gap energy. If the band gap energy of the cavity end face is too low, the laser light that is supposed to be emitted will instead be absorbed by the cavity end face. The absorption generates heat in the cavity end face, leading to damage or deterioration of the semiconductor laser element that is typified by COD (catastrophic optical damage), which means that it is difficult to raise output or sustain continuous drive for an extended period.

Various ways of dealing with this problem have been proposed, such as a method in which an oxide film or nitride film that cuts light absorption at the cavity end face and functions as a window layer is formed as a protective film of the cavity end face, or a method in which the thickness of the protective film formed on the cavity end face is varied according to the optical density to be emitted.

With a nitride semiconductor laser element, however, even if a protective film is formed from a material capable of cutting light absorption at the cavity end face, when the protective film is formed as a monocrystal or polycrystal, a difference in its lattice constant from that of the nitride semiconductor of the cavity end face can cause cracks to develop in the protective film or in the nitride semiconductor layer, so that the film cannot function as an end face protective film, and the element characteristics suffer. Particularly when the protective film has good crystallinity, although the end face protective film will be able to reflect or transmit laser light favorably, the protective film itself will be susceptible to cracking, creating problems with reliability. Thus, in the past, it was difficult to produce a nitride semiconductor laser element having a protective film with good crystallinity.

On the other hand, when the protective film is an amorphous film, stress in the film can cause the protective film to peel, or heat generated when light is absorbed at the end face can drive up the temperature of the cavity end face, which decreases the band gap of the cavity end face, further increases the absorption of outputted light, accelerates end face deterioration, and inhibits the desired function from being performed.

Also, even if a protective film is formed covering the semiconductor layer surface to prevent the protective film from peeling, the film will still peel away from the ends of the semiconductor layer surface under prolonged drive or high output drive. Also, when a protective film is formed covering the semiconductor layer surface from the cavity end face, the corners of the laser element are subjected to stress, which causes lifting or peeling of the protective film at the corners.

SUMMARY OF THE INVENTION

It is an object of the present invention to provide a nitride semiconductor laser element with which cracking of the nitride semiconductor and the protective film is suppressed, there is no separation of the protective film, high reliability is realized. Also, it is possible to provide a high-output nitride semiconductor laser element with a higher COD level.

The present invention provides a nitride semiconductor laser element, comprising: a nitride emiconductor structure having a first nitride semiconductor layer, a second nitride semiconductor layer, and an active layer provided between the first and second nitride semiconductor layers; a cavity end face provided to the nitride semiconductor structure; and a protective film having a hexagonal crystal structure, and having a first region provided on a first crystal surface of the nitride semiconductor structure in the cavity end face and a second region provided on a second crystal surface in the surface of at least one of the first and second nitride semiconductor layer. The protective film is a nitride film. The first and second regions of the protective film have crystal structures oriented in the same axial direction as that of the respective first and second crystal surfaces.

Further, the present invention provides a nitride semiconductor laser element, comprising: a nitride semiconductor structure having a first nitride semiconductor layer, a second nitride semiconductor layer, and an active layer provided between the first and second nitride semiconductor layers; a cavity end face provided to the nitride semiconductor structure; and a protective film having a hexagonal crystal structure, and having a first region provided on a first crystal surface of the nitride semiconductor structure in the cavity end face and a second region provided on a second crystal surface in the surface of at least one of the first and second nitride semiconductor layer. The protective film is a nitride film. The first and second regions of the protective film have a crystal structure oriented in the same axial direction as that of the respective first and second crystal surfaces. The protective film comprises a first face which is the surface of the first region, a second face which is the surface of the second region, and a third face which is located between the first and second faces and covers a corner of the nitride semiconductor structure.

With the present invention, the protective film is formed so as to come into contact with the nitride semiconductor layer at the cavity end face, and to come into contact with the front of the growth plane of the nitride semiconductor layer and/or the back of the substrate from the cavity end face, and further to come into continuous contact all the way to the electrode surface, which allows the contact surface area of the protective film to be increased in the region other than the cavity end face. Accordingly, the adhesion of the protective film to the cavity end face can be improved, and the protective film can be effectively prevented from peeling.

Also, by increasing the surface area of the protective film, heat transferred to the protective film can be dissipated more efficiently. Moreover, the COD level as well as the heat dissipation effect can both be raised by employing a protective film having a crystal structure oriented in the same axial direction as a crystal surface oriented in one axial direction of the nitride semiconductor layer.

By having the crystal structure of the protective film be different at the cavity end face and the nitride semiconductor layer surface, the back of the substrate, or the electrode surface, optimal adhesion can be ensured by suitably matching the crystal structure of the protective film to the members with which the protective film comes into contact and the properties thereof.

Furthermore, because the protective film has a first face that covers the cavity end face formed on the nitride semiconductor layer, a second face that covers the back of the substrate or the front of the growth plane of the nitride semiconductor layer, and a third face that is continuous between the first and second faces, there is less local stress in the protective film, and stress between the cavity end face and the protective film is relieved, which prevents cracking in the nitride semiconductor and the protective film and peeling of the protective film.

As a result, stable operation can be ensured, and it is possible to provide a high-output nitride semiconductor laser element with high reliability and a higher COD level.

BRIEF DESCRIPTION OF THE DRAWINGS

FIG. 6a is a cross section cut along the α line in FIG. 5, while

DETAILED DESCRIPTION OF THE PREFERRED EMBODIMENTS

Figure 1:
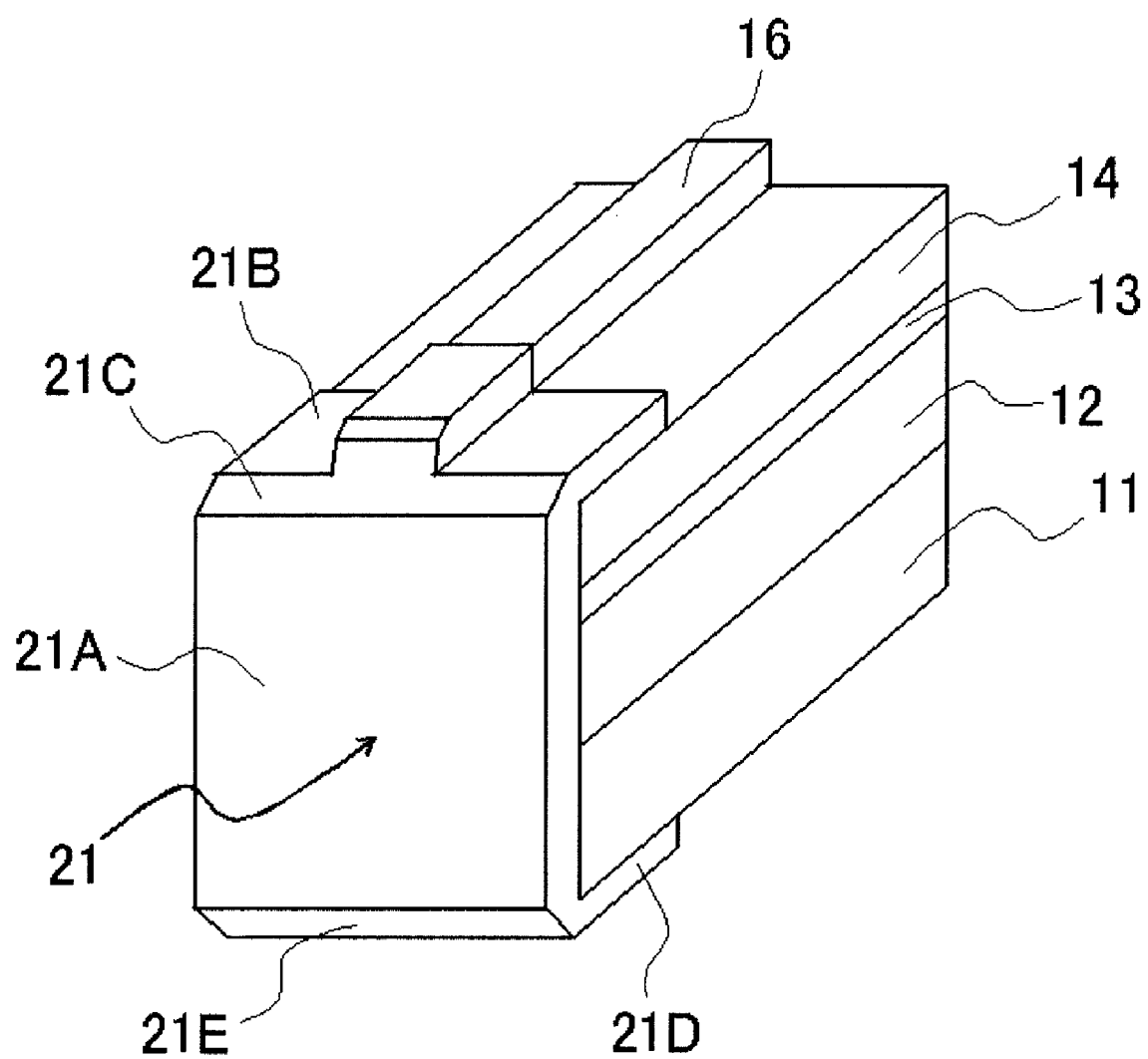
FIG. 1 is a simplified perspective view illustrating the structure of the laser element of the present invention.
Figure 2:
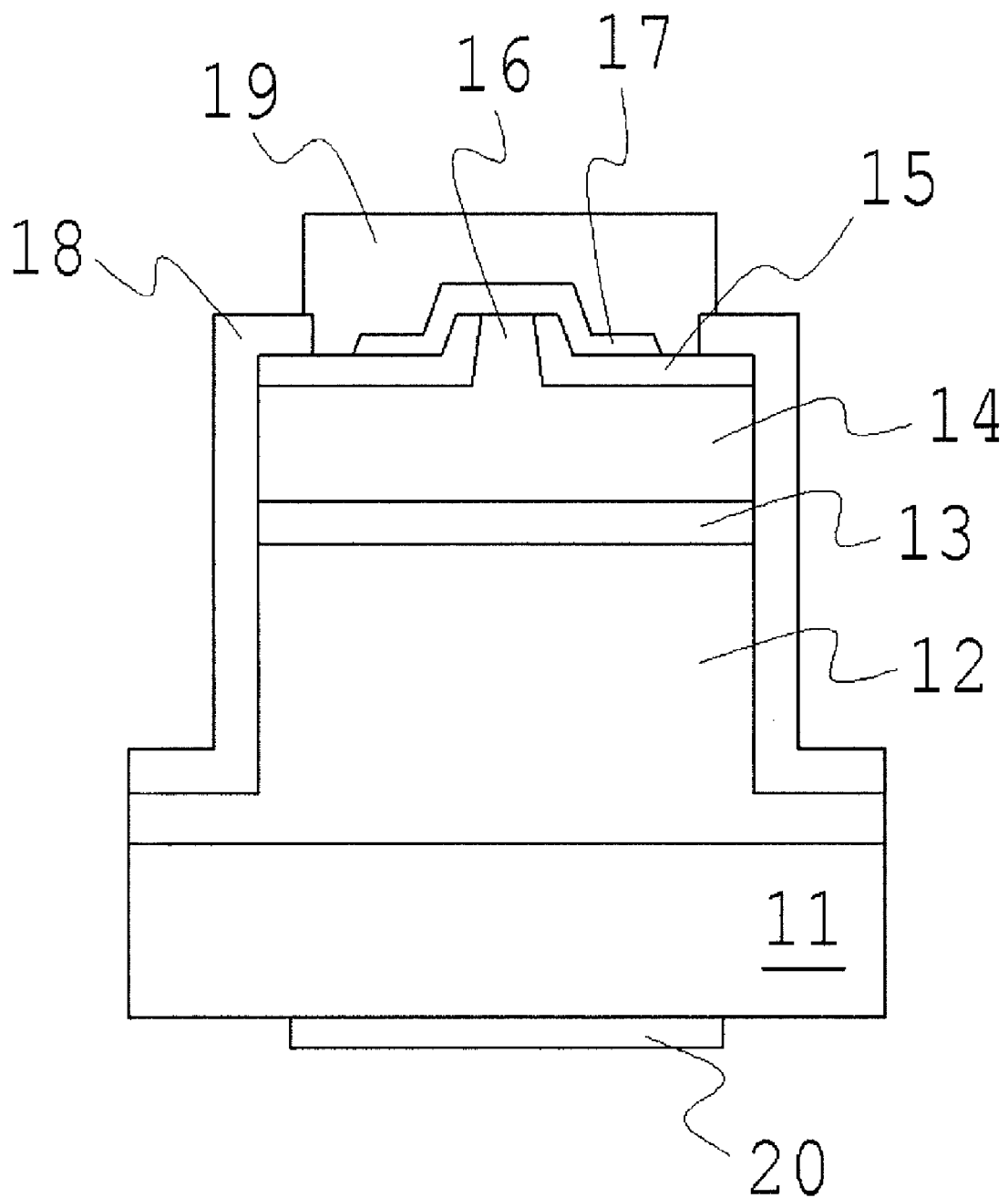
FIG. 2 is a simplified front side vertical cross sections illustrating the structure of the laser element of the present invention.
Figure 3:
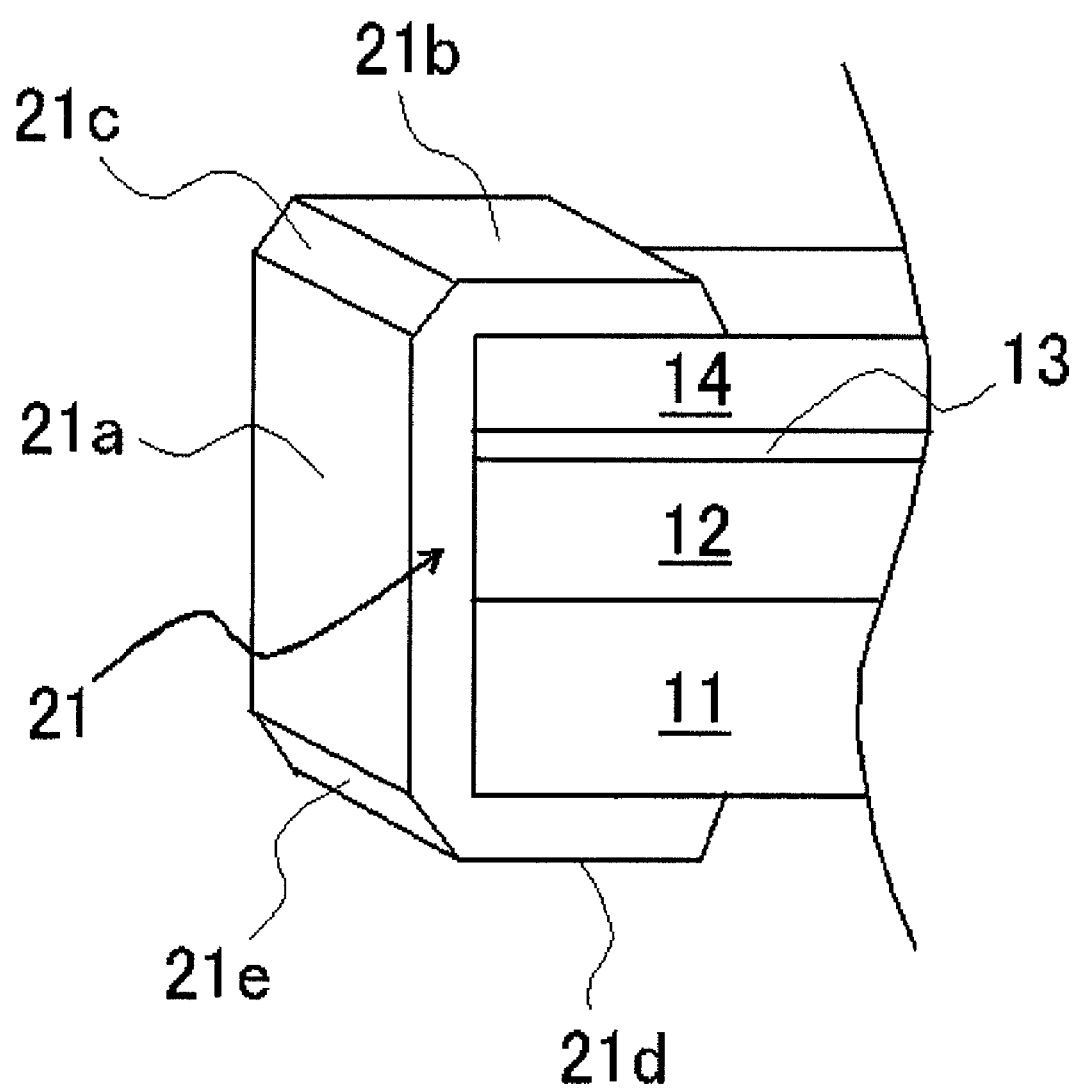
FIG. 3 is a simplified perspective view illustrating the structure of the protective film of the present invention.
Figure 9:
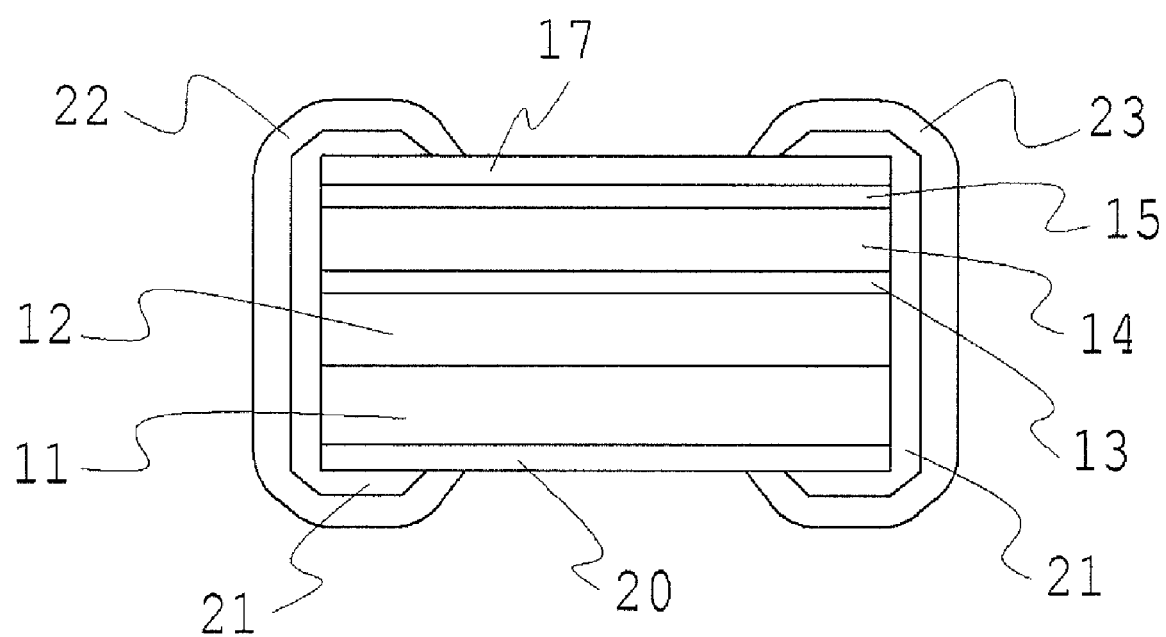
FIG. 9 is a simplified lateral side vertical cross section illustrating another structure of the protective film of the present invention.
Figure 10A:
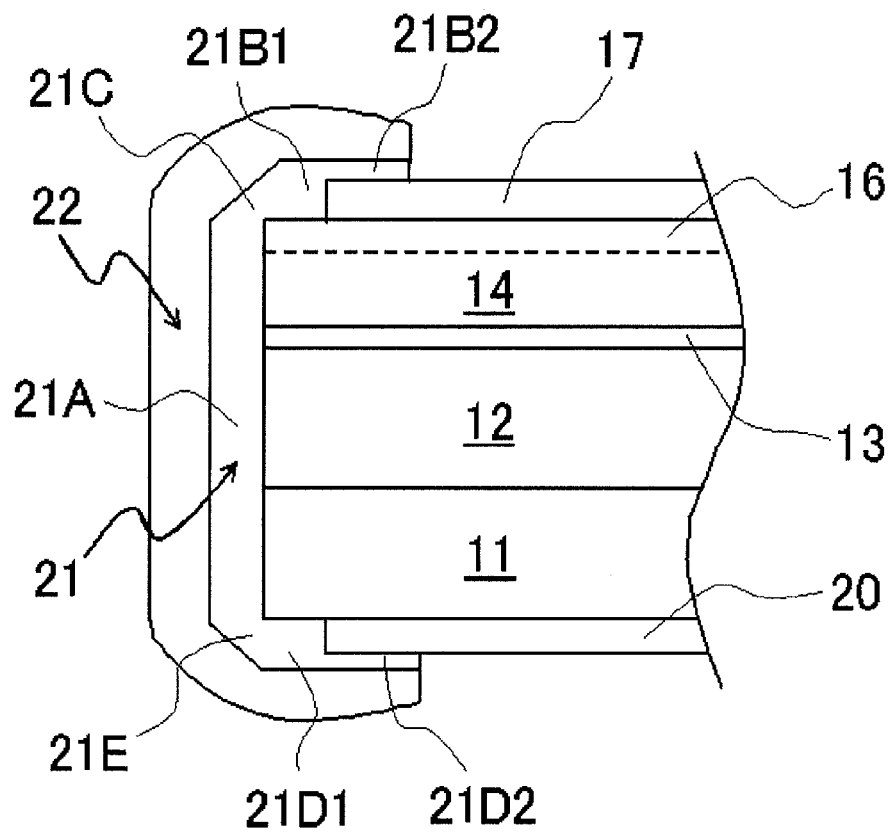
FIG. 10a is a simplified lateral side vertical cross section.
Figure 10B:
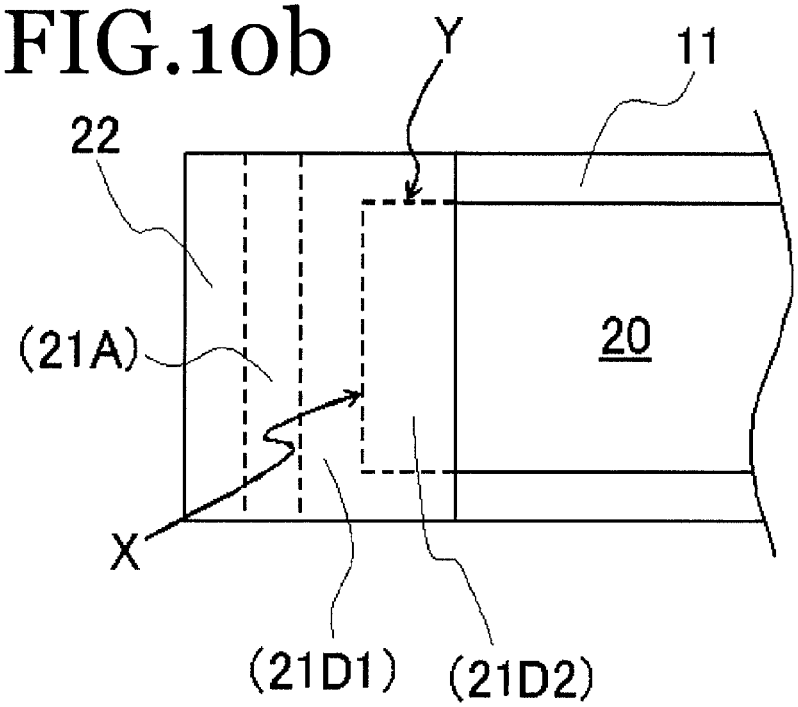
FIG. 10b is simplified rear side view, illustrating still another structure of the protective film of the present invention.
Figure 11A:
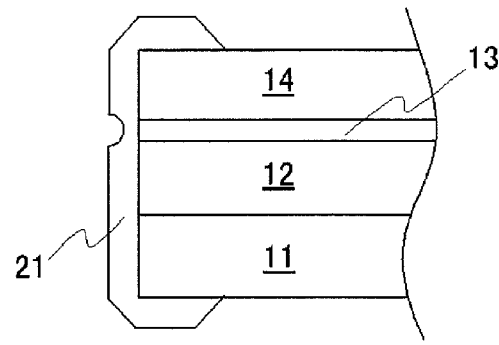
FIGS. 11a to 11d are simplified lateral side vertical cross sections illustrating still other structures of the protective film of the present invention.
Figure 11B:
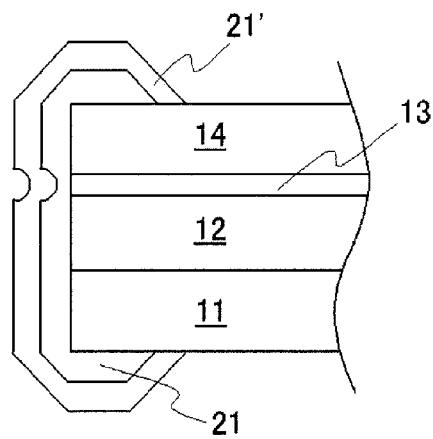
Figure 11C:
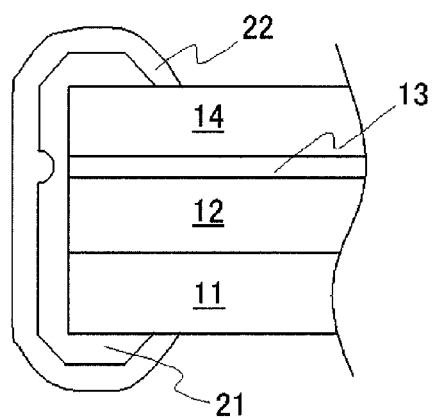
Figure 11D:
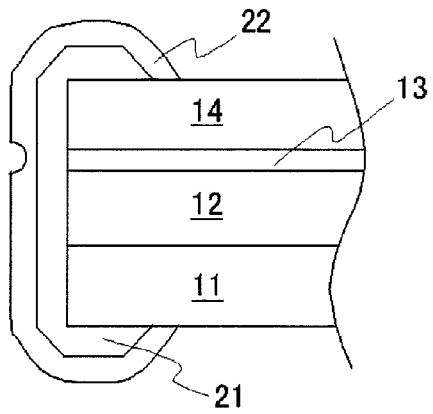

As typically shown in FIGS. 1, 2 and 3, for example, the nitride semiconductor laser element of the present invention mainly includes a first nitride semiconductor layer 12, an active layer 13, and a second nitride semiconductor layer 14 formed on a first main face of a conductive substrate 11 in this order. A cavity is formed by setting cavity end faces on opposed end faces of the nitride semiconductor layer, and the cavity end faces are covered by a protective film (see, 21A, 21B, 21C, 21D and 21E as shown in FIG. 1) and a second protective film (see, 22, 23 as shown in FIGS. 9 and 22 as shown in FIG. 10). When the first nitride semiconductor layer 12 is n side semiconductor layer and the second nitride semiconductor layer 14 is p side semiconductor layer, a ridge 16 is formed on the surface of the second nitride semiconductor layer 14, as shown in FIG. 2, an embedded film 15 is formed on the both sides of the ridge 16 and a p-side electrode 16 is formed on the top surface of the ridge 16. A third protective film 18 is formed on the side faces of the nitride semiconductor layer, and p pad electrode 19 is formed on the topmost surface thereof. An n-side electrode 20 is also formed on a second main face of the conductive substrate (the face on the opposite side from the face where the nitride semiconductor layer is formed).

Figure 4A:
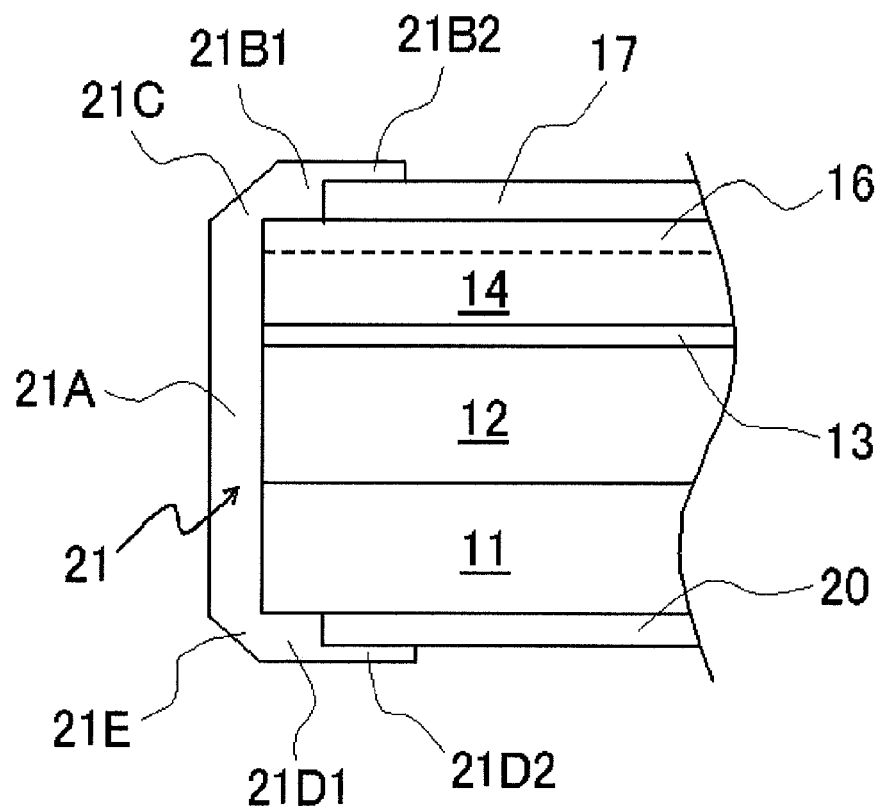
FIG. 4a is a simplified lateral side vertical cross section.

As shown in FIGS. 1, 3, and 4a, the protective film is a film formed on at least one cavity end face, is formed from the nitride semiconductor layer surface all the way to the cavity end face formed on the nitride semiconductor layer, and has a first face 21a that covers the cavity end face, a second face 21b that covers the second nitride semiconductor layer surface, and a third face 21c that is continuous between the first and second faces. The protective film is also formed from the cavity end face all the way to the second main face of the conductive substrate, and has a fourth face 21d that covers the second main face of the conductive substrate, and a fifth face 21e that is continuous between the first and fourth faces. That is, the protective film is equipped with regions of different crystal planes, and has at least a first region 21A having the first face 21a, a second region 21B having the second face 21b, and a third region 21C having the third face 21c in between the first and second regions. It further has a fourth region 21D having the fourth face 21d, and a fifth region 21E having the fifth face 21e between the fourth region 21D and the first region 21A.

In this specification, this protective film 21 will sometimes be referred to as a first film. Also, some of these members are not depicted, depending on the drawing.

The protective film may be a film composed of oxides (Si, Mg, Al, Hf, Nb, Zr, Sc, Ta, Ga, Zn, Y, B, Ti, etc.), nitrides (AlN, AlGaN, GaN, BN, etc.) or fluorides and the like. Among these, nitrides are preferable. From another standpoint, the film is preferably formed from a material with no absorption with respect to the oscillation wavelength of the laser element.

The protective film may be formed from different materials in the first to fifth regions, but is preferably formed from the same material. Forming it from the same material eliminates a difference in lattice constant between protective films, and forming a protective film with good crystallinity prevents cracks from forming in the nitride semiconductor layer and the protective film, and enhances the reliability of the laser element. Also, it prevents the yield and the element characteristics from being adversely affected by the admixture of impurities and so forth in the manufacturing process.

Examples of the crystal structure of the protective film include hexagonal system, cubic system, rhombic system and the like. The lattice constant is preferably close to that of the nitride semiconductor (e.g., the difference from the lattice constant of the nitride semiconductor is no more than 15%) because the protective film with good crystallinity can be formed. A film made from a material having a hexagonal crystal structure is especially favorable. The protective film is preferably composed of a material that contains such monocrystals and polycrystals, and has crystallinity at growing the film. Further, adhesion with the nitride semiconductor layer will be better if the above-mentioned protective film contains a monocrystal, the first face includes a crystal structure oriented along the crystal axis of the main peak at the cavity end face, the second face includes a crystal structure oriented along the crystal axis of the main peak at the growth plane of the nitride semiconductor layer, and the fourth face includes a crystal structure oriented along the crystal axis of the main peak at the second main face of the substrate.

The crystal structure of the protective film in this specification is a crystal structure, measured with an XRD device, in which the plane of the protective film in question has a peak with the desired axial orientation. Also, even if there are peaks with other axial orientation, the desired peak will be the strongest. For instance, when the cavity end face formed in the nitride semiconductor layer is the M-plane (1-100), if the crystal structure of the first face of the protective film that covers the cavity end face is measured with the XRD device, the peak of m-axial orientation will appear as the strongest peak.

In other words, in this specification, the fact that the orientation of crystals is different from that of the first region means that when the orientation of the crystal structure is measured with the XRD device, the crystal structure is such that the orientation of crystals in the region in question has a peak with a different axial orientation from that of the first region. Also, when the region in question has a peak with the axial orientation of the first region, a peak with different axial orientation is stronger than a peak with the axial orientation of the first region.

Moreover, besides the XRD (X-ray Diffraction Method), a similar evaluation is possible by using an electron diffraction method, for example an electron diffraction pattern.

The crystallinity of materials can be easily determined from an electron diffraction pattern produced by TEM.

The state of a protective film is generally classified as monocrystalline, polycrystalline, or amorphous, depending on the degree of crystallization of the material that makes up the protective film. Monocrystallines have almost no variation in lattice constant among materials, and there is almost no lattice plane inclination. To put this another way, the atoms in the material are arranged in a regular pattern, and order is maintained over an extended distance. Polycrystallines are made up of numerous microscopic monocrystallines, i.e., microcrystallines. An amorphous material is one that has no periodic structure such as that in a crystal, that is, it means that the atomic arrangement is irregular and there is no order over an extended distance.

The protective film of the present invention is mainly a crystalline material, particularly in the regions provided in contact with the nitride semiconductor crystal on which the regions are disposed. Also, the protective film may include amorphous material parts, particularly in the other region. More specifically, it is a film containing such monocrystals or polycrystals in the regions provided in contact with the nitride semiconductor crystal, and further, a film containing amorphous in the region overlying an electrode and an insulation film on the nitride semiconductor structure. On the other hand, the second protective film discussed below may be mainly formed a film having an amorphous.

Examples of the cavity end face in the present invention include the m-axis <1-100>, the a-axis <11-20>, the c-axis <0001>, and the r-axis <1-102>. That is, this plane is selected from the group consisting of the M-plane (1-100), the A-plane (11-20), the C-plane (0001), and the R-plane (1-102), and m-axial orientation is particularly favorable. Here, "−1" and "−2" in Miller index indicates "1" and "2" with a bar on top, respectively. In this specification, Miller index will be shown in the same manner. The "cavity end face" referred to here means a region including the optical waveguide region or the region corresponding to an NFP (near field pattern; the optical intensity distribution near the emission end face), but does not necessarily refer to a plane including all of a specified region, and may be most of the region of the cavity end face including the optical waveguide region or the region corresponding to an NFP. Therefore, the orientation of the cavity end face means the orientation that is predominant at the cavity end face or the orientation of most of the region.

That is, in this specification, it should go without saying that even when the crystal plane (planar orientation) of the protective film is referred to as being the M-plane, for example, this does not refer to just the M-plane composed of a monocrystal, but rather includes a polycrystalline state as well. Naturally, the same applies to other crystal planes.

The first face, the second face, the third face, the fourth face and the fifth face (e.g., the first region, the second region, the third region, the fourth region and the fifth region) constituting the protective film will now be described in detail by the followings.

The first region is a region that covers the cavity end face. It preferably covers at least the region corresponding to the NFP or the optical waveguide region including the active layer. This allows it to function as an end face protective film that reflects or transmits laser light. In this case, it is preferably formed from a material whose band gap energy is higher than that of the active layer, and whose refractive index is lower. Examples of the first region include one formed with orientation along the m-axis, the a-axis, the c-axis, or the r-axis. This first region also preferably includes a crystal structure oriented in the same crystal axial direction as the crystal axial direction in which the cavity end face is oriented, with m-axis orientation being particularly favorable. If the first region of the protective film is formed so as to include a crystal structure oriented in the same axial direction as the crystal axial direction in which the cavity end face is oriented, the quality of the protective film will be better, adhesion between the cavity end face and the protective film can be increased, and even when the semiconductor laser element is being driven, stress can be relieved so as to prevent cracking of the nitride semiconductor layer, and the COD level can be raised. The reason for this is that this widens the band gap energy of the emission region of the exit-side end face, forms a window structure, and prevents deterioration of the exit-side end face.

The protective film preferably has a FWHM (Full Width at Half Maximum) of $2.0°$ or less, and better yet $1.0°$ or less, over a cavity end face 20. The term "FWHM" means the FWHM of an X-ray rocking curve obtained by X-ray diffraction analysis. This allows the COD level to be raised.

On the cavity end face, the protective film may have a plurality of crystal regions each having an crystal orientation, especially an axial direction thereof, different from each other, in particular, a crystal of the protective film in the region disposed on a side surface of the active layer or the active layer and neighborhood thereof, e.g. NFP region, may be oriented in different crystal axial direction from that of the nitride semiconductor crystal in the aforementioned active layer region. In this case, in a region other than the side surface of the active layer, especially in the region disposed on sides of the first or second nitride semiconductor, namely on the side surface of the first or second semiconductor or the substrate, the first or second regions may be provided, respectively. For example, the protective film in the first region is preferably formed so as to include a crystal structure oriented in the same axial direction as the crystal axial direction in which the side surface of the second nitride semiconductor layer of the cavity end face side is oriented. Accordingly, on the aforementioned active layer region, the protective film may also comprise a crystal structure which is aligned with a different axial direction from that of semiconductor crystal.

As discussed above, the orientation in the first region of the protective film is not limited to just orientation in the same crystal axial direction as the crystal axial direction in which the cavity end face is oriented, and may encompass other orientations. That is, having the same axial orientation refers not only to a state in which monocrystals are oriented in exactly the same crystal axial direction, but also to a state in which polycrystals are admixed, but the sites where they are oriented in the same crystal axial direction are uniform, or a state in which the polycrystals are uniformly distributed. In such a case of a polycrystalline state, the difference in the lattice constant from that of the cavity end face does not strictly appear, and this difference can be moderated. In particular, if the thickness of the first region is at least 20 nm, a higher proportion of the region will exhibit another orientation.

The second region is a region that covers the surface of the semiconductor layer. As discussed below, it may be formed so as to cover part of an electrode or embedding film formed on the semiconductor layer surface. This reduces peeling of the electrode or embedding film. If the protective film covers only the cavity end face, and has no second face or fourth face, there is the possibility that peeling may occur at the interface between the protective film and the cavity end face. Furthermore, forming a protective film such as this makes the manufacturing process more complicated, and may lead to problems such as damage to the ridge formed on the semiconductor layer surface. Also, a ridge or the like is formed on the semiconductor layer surface, making the surface uneven, but covering this surface with the protective film maintains strength at the places where peeling and so forth are likely to occur. Examples are when the protective film of the second region is formed oriented along the m-axis, the a-axis, the c-axis, or the r-axis. The second region preferably has different orientation from that of the first region, and more preferably includes a crystal structure oriented in the same crystal axial direction as the crystal axial direction in which the surface of the semiconductor layer (crystal growth surface) is oriented. C-axis orientation is particularly favorable. This affords better adhesion between the semiconductor layer surface and the protective film.

When the protective film is thus formed not only on the cavity end face of the nitride semiconductor layer, but also continuously covering the upper face of the ridge formed on the nitride semiconductor layer, stress within the nitride semiconductor layer causes less peeling of the protective film.

Figure 5:
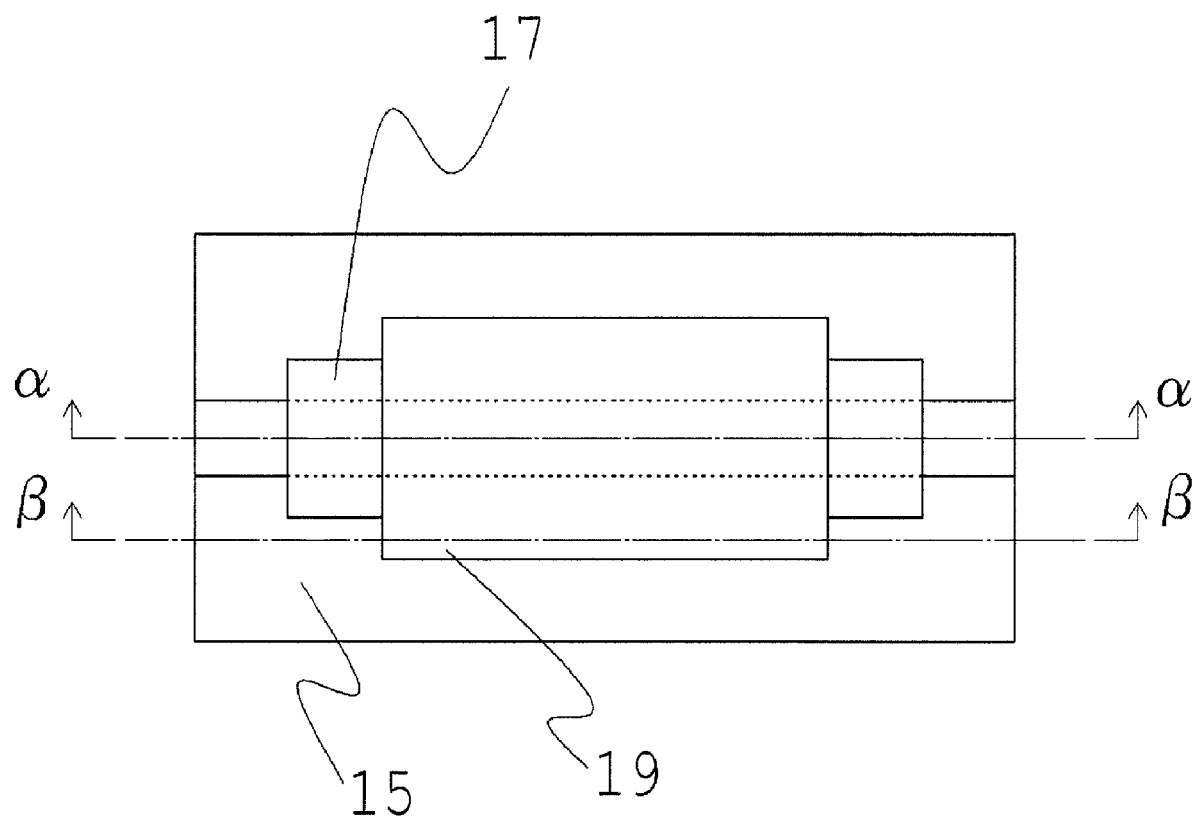
FIG. 5 is a simplified top view illustrating the structure of the laser element of the present invention.
Figure 6A:
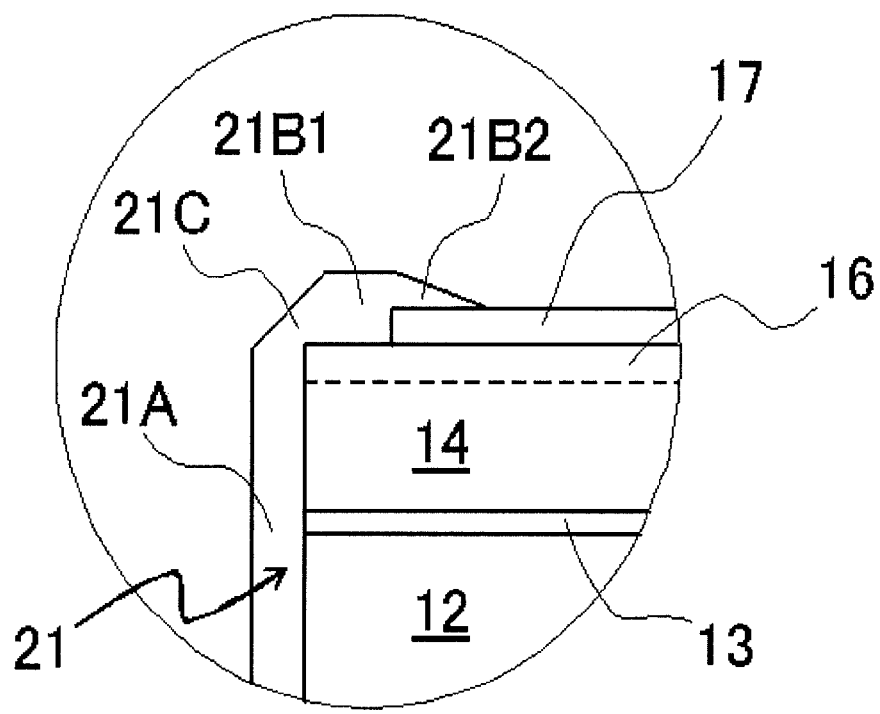

FIG. 5 is a top view of the above-mentioned nitride semiconductor laser element, and is a diagram in which the protective film is not shown. FIG. 6a is a cross section cut along the α-line in FIG. 5, while FIG. 6b is a cross section cut along the β-line.

As shown in FIG. 6a, with a nitride semiconductor laser element in which an electrode is formed away from the cavity end face on the upper face of a ridge formed on the nitride semiconductor layer, the second region 21B of the protective film has a region 21B1 in contact with the ridge from substantially directly over the cavity end face to the end of the electrode, and a region 21B2 in contact with the electrode formed on the ridge. The protective film provides continuous coverage from the cavity end face to the upper face of the ridge, and also covers the end of the electrode formed on the upper face of the ridge. When the protective film has the region 21B1 in contact with the nitride semiconductor layer at the upper face of the ridge, the adhesion of the protective film is improved. Furthermore, there is less peeling of the electrode from the end. Also, since the protective film region 21B2 in contact with electrode is a region containing an amorphous component, stress is relieved in the nitride semiconductor layer enough that no cracks develop in the nitride semiconductor layer.

Figure 6B:
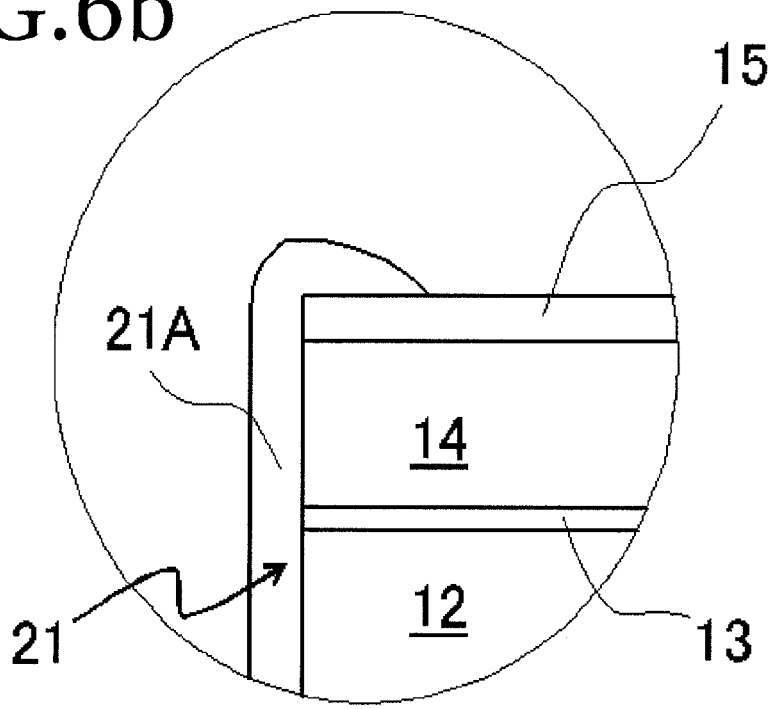
FIG. 6b is a cross section cut along the β line.

Also, as shown in FIG. 6b, the protective film is formed at the upper part of an embedding film formed on both sides of the ridge.

The fourth region is a region covering the second main face of the substrate. The fourth region preferably has an orientation that is different from the orientation of the first region, and preferably includes a crystal structure oriented in the same crystal axial direction as the crystal axial direction in which the second main face of the substrate is oriented. Examples include the protective film of the fourth region formed oriented along the m-axis, the a-axis, the c-axis, or the r-axis. Usually, when the cavity end face has m-axis orientation, the first main face of the substrate has c-axis orientation. Therefore, on the second main face side of a substrate having such orientation, the fourth region of the protective film preferably includes a crystal structure with c-axis orientation. In particular, when the substrate is a nitride substrate (such as a GaN substrate), the second main face is a Ga-polarity surface in which elemental germanium is arranged, or an N-polarity surface in which elemental nitrogen is arranged, but taking into account factors such as the growth of the nitride semiconductor layer laminated on the first main face of the GaN substrate, and adhesion to the electrode formed on the second main face, it is preferable for the second main face of the GaN substrate to be a plane in which elemental nitrogen is arranged, that is, an N-polarity surface (000-1).

This increases adhesion of the protective film to the substrate, prevents the protective film from peeling away from the substrate, and also improves the adhesion of the film in contact with the cavity end face. As described here, the substrate is disposed under the first nitride semiconductor layer, however the substrate may be removed. In this case, the protective film in the fourth region may cover the bottom surface of the first nitride semiconductor layer directly in similar way as the above-mentioned the structure having the substrate covered with the protective film on the second main surface thereof.

Also, just as with the second region, the fourth region may be formed so as to cover the end of the electrode formed on the second main face of the substrate. The region in contact with the electrode is preferably amorphous. The material of which the electrode is made is generally a metal, and when a protective film that has good crystallinity is formed on a metal, it will be prone to peeling, but if it is amorphous, adhesion of the protective film to the electrode surface can be ensured.

Thus, the protective film formed on the cavity end face, the nitride semiconductor layer surface, and the second main face of the substrate may be partially amorphous. Usually, the amorphous content will tend to be higher in the protective film formed on the nitride semiconductor layer surface and the second main face of the substrate than in the protective film formed on the cavity end face.

The third region is formed between the first and second regions, while the fifth region is a region formed between the first and fourth regions. These preferably cover at least the corners of the nitride semiconductor laser element. Also, the third face preferably has a crystal plane that is different from that of the first face or the second face, and the fifth face preferably has a crystal plane that is different from that of the first face or the fourth face. When a film with good crystallinity is formed as an end face protective film for a laser element, there will be a lattice constant differential and strain will occur between the cavity end face and the semiconductor layer surface, and the second main face of the substrate. This generates stress between the nitride semiconductor and the protective film. In this case, the greatest load is at the corners formed by the cavity end face and the semiconductor layer surface, and the second main face of the substrate, the protective film lifts up from these portions, and peeling and cracking occur. However, forming the third face and the fifth face segments this stress, so that less stress is applied locally within the protective film, and stress is relieved between the cavity end face and the protective film, which prevents the protective film from peeling. This makes it possible to obtain a protective film with good adhesion between the cavity end face and the semiconductor layer surface, and the second main face of the substrate, and allows a nitride semiconductor laser element with high reliability to be obtained.

One or more facets are preferably formed on the crystals of the protective film in the third and fifth regions. There are no particular restrictions on the planar orientation of these facets, but when the protective film has a hexagonal crystal structure, the planar orientation of the first region will be different from that of the second and fourth regions, and is preferably the M-plane (1-100), the A-plane (11-20), the C-plane (0001), the R-plane (1-102), etc. Providing a third face between the first and second faces relieves stress between the first and second regions, increases the overall adhesion of the protective film, and allows a nitride semiconductor laser element with high reliability to be obtained. The same applies to the fifth face of the fifth region.

The composition and/or orientation between the various regions may change abruptly or may change gradually. For example, when the orientation between the first and second regions changes abruptly or gradually, crystals having the orientation of the first region and crystals having the orientation of the second region will both be present in the region of this change, and the orientation of the film is preferably varied by varying the proportions thereof so that the orientation of the second region increases becomes more prevalent over the orientation of the first region.

Figure 7A:
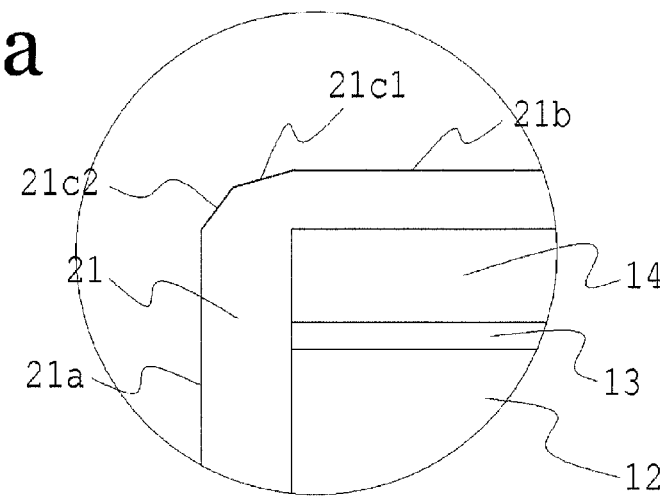
FIGS. 7a to 7c are simplified lateral side vertical cross sections illustrating the structure of the protective film of the present invention.
Figure 7B:
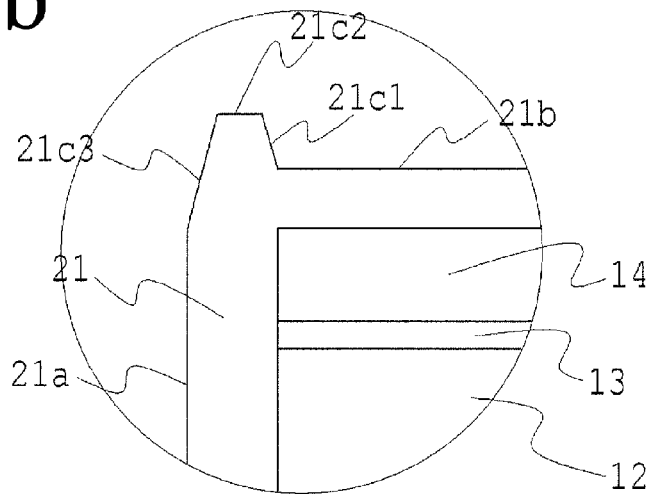
Figure 7C:
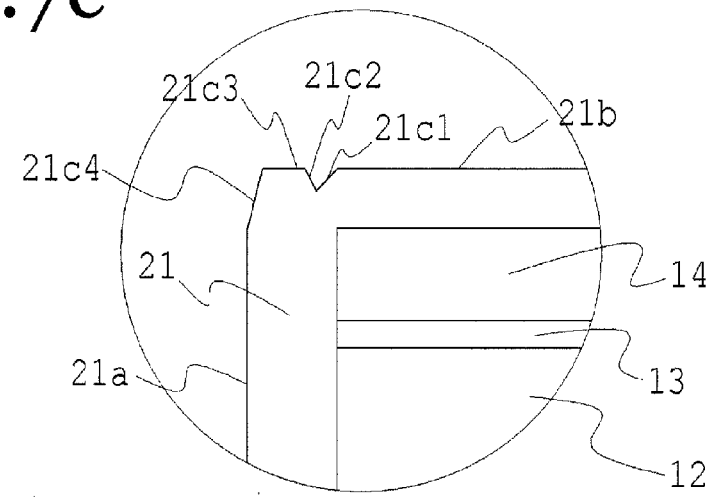

Also, if a facet is formed between the first and second regions, or between the first and fourth regions, regardless of the planar orientation thereof, there may be a plurality of faces, as shown in FIGS. 7a, 7b, and 7c. For example, in FIG. 7a, there are two third faces 21c1 and 21c2. In FIG. 7b, there are three third faces 21c1, 21c2, and 21c3. In FIG. 7c there are four third faces 21c1, 21c2, 21c3, and 21c4. In these cases, the portion that is continuous with the first face is a different face from the first face, and the portion that is continuous with the second face preferably has a facet formed in a different planar orientation from that of the second face. Forming a plurality of facets relieves stress in the protective film, and reduces cracking in the semiconductor layer and the protective film, and peeling of the protective film.

Also, the third region is usually formed continuously between the first and second regions, but as shown in FIG. 7c, it may be formed so that part of it is segmented in the thickness direction within in the third region. This segments the stress exerted in the first region direction and the second region direction, and reduces lift and peeling of the protective film. The same applies to the fifth region.

An example of the nitride semiconductor laser element of the present invention is one in which the nitride semiconductor layer is formed on the C-plane of the substrate, the semiconductor layer surface is the C-plane, and the cavity end face is the M-plane. In this case, a protective film including a crystal structure with m-axis orientation is formed in the first region, a protective film including a crystal structure with c-axis orientation is formed in the second and fourth regions, a protective film having a crystal structure whose orientation is different from that of the first and second regions is formed in the third region, and a protective film having a crystal structure whose orientation is different from that of the first and fourth regions is formed in the fifth region. Forming the protective film in this way, as discussed above, relieves stress in the protective film, and allows the overall adhesion of the protective film to be increased. More specifically, an example of the material of such a protective film is AlN. The protective film of the present invention may be formed on the cavity end face on either the light reflecting side or the light emitting side, or may be formed on both of the cavity end faces.

The range over which the various regions of the protective film are formed is preferably such that the first region is the entire cavity end face, or more specifically, about 80 µm (about 60 to 120 µm). The range of the second region is about 10 µm or less from the cavity end face, and preferably about 5 µm or less. From another standpoint, the contact surface area between the protective film and the nitride semiconductor layer surface is preferably about 500 µm$^2$ or more, and more preferably about 600 to 3000 µm$^2$ or more. Also, the range of the third and fifth regions is preferably about 1 nm to 1 µm.

Figure 4B:
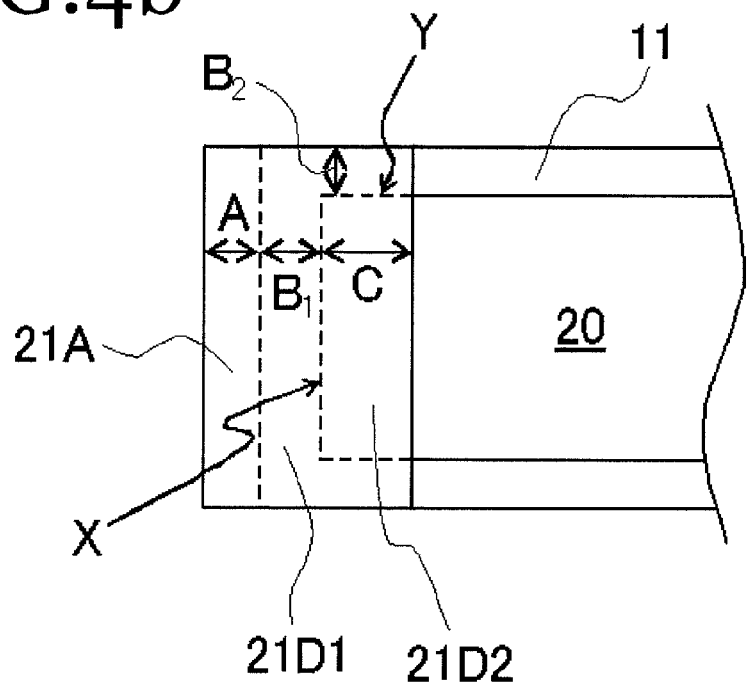
FIG. 4b is simplified rear side view, illustrating the structure of the protective film of the present invention.

In the fourth region, when the protective film covers the end of the electrode, it is favorable, for example, for the protective film 21D2 that is in contact with the electrode to be in contact with the electrode at a distance of about 30 µm or less, and preferably about 25 µm or less, from the end face on the cavity end face side of the electrode (see C in FIG. 4b). Alternatively, it is favorable for this film to be in contact with the electrode at a distance of about 40 µm or less, and preferably about 35 µm or less, from the cavity end face. In other words, the surface area over which the protective film is in contact with the electrode is about 500 µm$^2$ or more, with about 1000 to 7500 µm$^2$ being even better.

In particular, since the electrode formed on the second main face of the substrate is usually disposed farther to the inside than the substrate end face, the contact surface area of the protective film 21D1 in contact with the second main face of the substrate is not just the surface area found from (distance B$_1$ from the cavity end face to the electrode)×(width of the substrate), but rather than surface area obtained by adding the surface area on both sides, found from (distance B$_2$ from the substrate side face to the electrode)×(distance C from the end face of the electrode on the cavity end face side to the end face of the protective film).

There are no particular restrictions on the thickness of the protective film, but it is, for example, from the level of a single atom to 100 nm, and preferably from 5 to 50 nm. Making the protective film a thin film such as this prevents cracks from developing in the nitride semiconductor. The thickness of the protective film at the cavity end face does not necessarily have to be uniform, and may be a thin film or a thick film in a region corresponding to the NFP or the optical waveguide region, for example. Also, the thickness may be the same in the first region as in the second and fourth regions, or the one or the other may be thicker. Preferably, the second and fourth regions are thinner than the first region. Making the first region thicker than the second and fourth regions reduces peeling of the protective film, and relieves enough of the stress in the nitride semiconductor layer that cracks will not develop. Furthermore, the thickness may change gradually or in steps at the nitride semiconductor layer surface, the second main face of the substrate, and the electrode surface. In particular, depending on the film formation method, it is preferable for the thickness to decrease from the cavity end face toward the nitride semiconductor layer surface, the second main face of the substrate, and the electrode surface. This gradually relieves stress in the ends of the protective film.

Usually, with a semiconductor laser element, when the thickness of the protective film is increased, the difference in the lattice constant between the protective film and the nitride semiconductor layer makes the protective film more susceptible to cracking. In view of this, the adhesion of the protective film to the cavity end face can be better ensured, and the COD level can be further raised, by keeping the thickness of the protective film to a level at which cracking will not occur, and forming the protective film so as to sandwich the laser element from the cavity end face all the way to the nitride semiconductor layer surface, the second main face of the substrate, and the electrode surface, and also having the crystallinity be different at the various surfaces.

The protective film can be formed, for example, by a method that is known in this field. For instance, this can be vapor deposition, sputtering, CVD (Chemical Vapor Deposition), MBE (Molecular Beam Epitaxy), reactive sputtering, ECR (Electron Cyclotron Resonance) plasma sputtering, magnetron sputtering, ion beam assist deposition, ion plating, laser ablation, spraying, spin coating, dipping, a combination of these two or more methods, a combination of these methods and oxidation treatment (thermal treatment), or any of various other methods. If the combination is adopted, it may be unnecessarily to form and/or treat simultaneously or continuously, it may firstly form the film followed by treating it, and vice versa. Among these, it is preferably ECR plasma sputtering because it is relatively easy to control the crystal structure for growing the protective film.

In particular, to obtain a film in which the first region of the protective film is disposed in the same crystal axial direction as the crystal axial direction in which the cavity end face is oriented, or to increase the orientation in the same crystal axial direction as the crystal axial direction in which the cavity end face is oriented, although it will depend on the film formation method, it is preferable to control film formation by subjecting the cavity end face to a nitrogen plasma treatment prior to film formation, or to adjust the film formation rate to a relatively slow rate, or to control the atmosphere during film formation to a nitrogen atmosphere, for example, or to adjust the film formation pressure to a relatively low level, etc. or combine two or more of these approaches.

To obtain a film in which the second region of the protective film is disposed in the same crystal axial direction as the crystal axial direction in which the nitride semiconductor layer surface is oriented, or to increase the orientation in the same crystal axial direction as the crystal axial direction in which the nitride semiconductor layer surface is oriented (the same applies to the fourth region of the protective film and to the second main face of the substrate), it is preferable to control film formation by adjusting the pressure during film formation to be relatively high, or to adjust the film formation rate to be relatively slow, for example, or to combine two or more of these approaches, although this will depend on the film formation method.

Also, the nitrogen partial pressure may be gradually or suddenly changed during film formation by various methods, or the film formation pressure may be gradually or suddenly changed. Also, different film formation methods may be employed for each region, such as forming the first region by ECR plasma sputtering and the second region or the fourth region by magnetron sputtering.

Before the protective film is formed, the surface of the cavity end face, at least on the side where the protective film is formed, is preferably pretreated. There are no particular restrictions on the method of this pretreatment, but it can be washing, plasma treatment, or heat treatment. "Plasma treatment" here is treatment in an atmosphere containing oxygen and/or an atmosphere containing nitrogen. Performing it in an atmosphere containing nitrogen is particularly favorable, and setting the nitrogen content at 20% or higher is better.

Also, the nitrogen partial pressure, film formation pressure, and other such conditions may be varied during the film formation by various methods. In adjusting the film formation pressure, when the axial orientation of the crystal structure of the first region is to be increased, the film is preferably formed at a low vacuum, and when the axial orientation of the crystal structure of the second or fourth region is to be increased, the film is preferably formed at a high vacuum. Also, the distance between the target and the sample is preferably increased when the axial orientation of the crystal structure of the first region is to be increased, and is preferably shortened when the axial orientation of the crystal structure of the second or fourth region is to be increased. Also, the axial orientation of the crystal structure of the first region can be further increased by forming the film at a low vacuum and lengthening the distance between the target and a sample, and it is believed that the axial orientation of the crystal structure of the second region or fourth region can also be increased at this time. Also, when a nitride film is used for the above-mentioned protective film, if the nitrogen flow in the film formation atmosphere is reduced with respect to the argon flow, the film formation rate can be raised for the first region, and the thickness of the first region can be greater than the thickness of the second or fourth region.

When a film is formed by sputtering, examples include a method in which the protective film material is used as the target, and the film formation is gradually or abruptly increased, a method in which the RF power is gradually or abruptly increased (the range over which it is increased is about 50 to 500 W), a method in which the distance between the target and the sample is gradually or abruptly changed (the range over which it is changed is about 0.2 to 3 times the original distance), and a method in which the pressure during film formation is gradually or abruptly decreased (the range over which it is decreased is about 0.1 to 2.0 Pa).

More specifically, when the film formation rate is adjusted, the protective film is preferably formed at a rate of 0.5 to 10 nm/min, and then at a rate that is at higher rate than that of at the beginning. Also, when RF power is adjusted, the protective film is preferably formed at a power of 100 to 600 W and at microwave power of 300 to 600 W, and then (e.g., at changing film formation rate) at a power that is at least as high. After that, the protective film may be subjected to a heat treatment or light exposure treatment. When a film is formed by sputtering, the temperature of the substrate is gradually or abruptly raised or lowered (the range over which it is changed is about 50 to 500° C.).

Another method is one in which the film is formed while the position of the sample surface, using the surface of the target as a reference, is angled, rather than facing squarely. The inclination angle $\theta$ is $0°<\theta<90°$, and preferably $20°\leq\theta<90°$. It is believed that as the inclination angle $\theta$ increases within this range, the crystallinity of the protective film rises. Also, the crystallinity of the protective film can be improved by forming the protective film by a combination of these methods.

As to the method for forming the facets (the third and fifth faces), a protective film having facets can be obtained by adjusting the film formation rate. Such the film can be obtained by raising the film formation rate when the axial orientation of the crystal structure of the first region is to be increased, or by lowering the film formation rate when the axial orientation of the crystal structure of the second or fourth region is to be increased.

Also, Such the film can be obtained by raising the film formation pressure when the axial orientation of the crystal structure of the first region is to be increased, or by lowering the pressure when the axial orientation of the crystal structure of the second or fourth region is to be increased. Film formation can be controlled by using one or more of these methods.

Although it depends on the combination of conditions, if the film formation rate is lowered or if the nitrogen flow is increased with respect to the argon flow, the ratio of the thickness of the second or fourth region to the thickness of the first region of film formed in a specific length of time can be increased, and the number of third faces and fifth faces can be increased. Also, it is believed that the third and fifth faces can be formed relatively easily by performing pretreatment using nitrogen plasma.

Figure 8A:
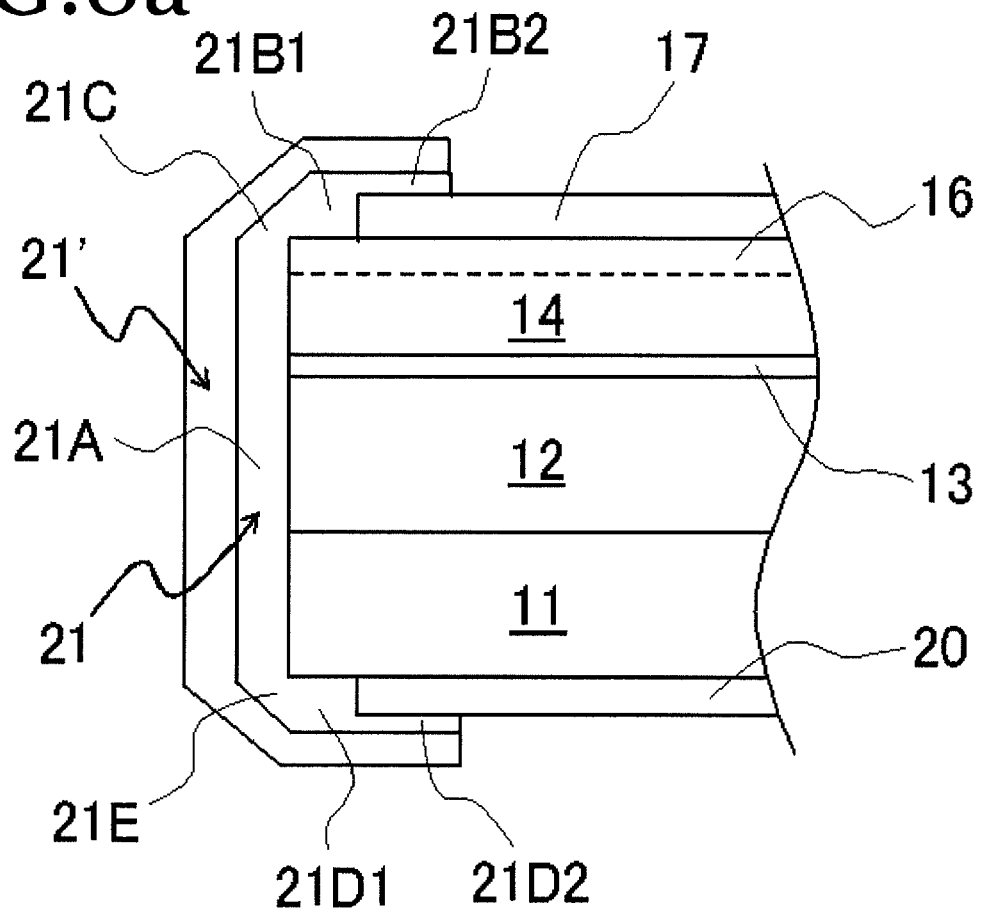
FIG. 8a is a simplified lateral side vertical cross section.
Figure 8B:
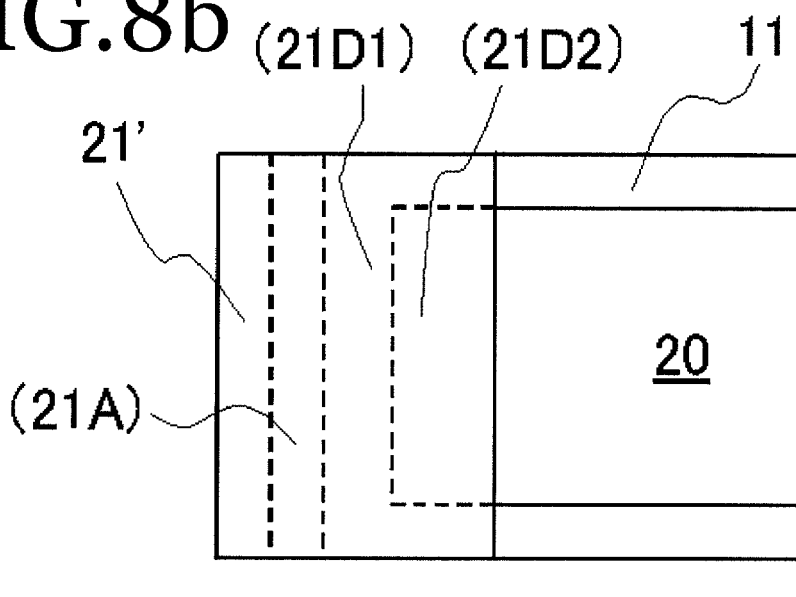
FIG. 8b is simplified rear side view, illustrating another structure of the protective film of the present invention.

Also, with the nitride semiconductor laser element of the present invention, the above-mentioned protective film may be a multilayer film. An example of this, as shown in FIG. 8, is a configuration in which the above-mentioned protective film serves as a first film, and a second film is formed over this first film. This second film preferably has a crystal structure whose axial orientation is different from that of the first film at the cavity end face, or is oriented in the same crystal axial direction as the first film, but is made of a different material. When the first film is oriented along the m-axis, the second film is preferably oriented in a different crystal axial direction from that of the first film, such as a film with c-axial orientation. When the second film having a crystal structure whose axial orientation is different from that of the first film is formed over the first film, this relieves stress caused by a difference in the lattice constants or the coefficients of thermal expansion between the nitride semiconductor layer and the first film, and prevents the protective film from peeling. The second film is preferably composed of the same material as the first film, which prevents the yield and element characteristics from being adversely affected by the admixture of impurities and so forth in the manufacturing process.

Also, in this case, the first film preferably includes a crystal structure oriented in the same crystal axial direction as the crystal axial direction in which the cavity end face is oriented. This widens the band gap energy of the exit-side end face, forms a window structure, and prevents deterioration of the exit-side end face. Forming the second film over this relieves stress and reduces cracking in the nitride semiconductor constituting the cavity end face, and improves adhesion with the cavity end face, thereby preventing peeling and raising the COD level. The second film is preferably thick enough to relieve stress between the nitride semiconductor layer and the first film. From the standpoint of heat dissipation from the end face, it is preferable to form the second film somewhat thick. There are no particular restrictions on the thickness of the second film, but it may be from 10 to 300 nm, for example.

The second protective film also can be formed, for example, by a method that is known in this field just like the above described the first film. In particular, the second film preferably has a crystal structure whose axial orientation is different from that of the first film, although it will depend on the film formation method, it is preferable to adjust the film formation rate to a relatively fast rate, or to adjust the nitrogen partial pressure to low level, or to adjust the film formation pressure to a relatively high level, etc., or to combine two or more of these approaches.

Also, with the nitride semiconductor laser element of the present invention, as shown in FIGS. 9 and 10, second protective films 22 and 23 with different film quality, material, or composition are preferably laminated over the first or second film. The second protective film may be a film composed of oxides of Si, Mg, Al, Hf, Nb, Zr, Sc, Ta, Ga, Zn, Y, B, Ti, etc., preferably be a film composed of $SiO_2$. The second protective film may be has any of single layer or laminated structure. The second protective film is formed from a single layer of Si or Al oxide, or a laminated structure of Si and Al oxides. Forming these films prevents changes in the composition of the first and second films, and allows the underlying protective films (the first film and second film) to be affixed more securely to the cavity end face. The second protective films are preferably formed from amorphous films. This relieves stress better at the interface between the protective film and the nitride semiconductor layer, while affording even better adhesion of the protective film.

It is also preferable for the thickness of the second protective films to be greater than the thickness of the first film or the combined thickness of the first and second films. Forming an amorphous second protective film over a first film that includes a crystal structure oriented in the same crystal axial direction as the crystal axial direction in which the cavity end face is oriented relieves the stress generated between the cavity end face and the first film, and improves the adhesion of the protective film. When the second film is formed, if the second film has a different crystal structure from that of the first film, then stress produced between the cavity end face and the first and second films can be relieved, and peeling of the protective film and the nitride semiconductor layer can be reduced. Forming the amorphous second protective film enhances the above-mentioned stress relief, and further improves the adhesion of the protective film. This prevents peeling of the protective film overall.

More preferably, the thickness of the second protective films is at least 1.5 times the thickness of the first film or the combined thickness of the first and second films, and the total thickness of the protective film is 2 μm or less. This makes the above-mentioned effect even more pronounced. Also, the total thickness of the protective film is about 5 nm to 2 μm, for example.

Also, as shown in FIG. 9, the protective film and the second protective films may both be formed not only on the exit side of the cavity end face (the face where laser light is taken off), but also on the reflecting side, and both may have different materials, film thickness, etc. The second protective film 22 on the exit side is preferably formed as a single layer of $SiO_2$, or as a laminated structure of a silicon oxide and an aluminum oxide. Also, examples of the second protective film on the reflecting side include a laminated structure of a silicon oxide and a zirconium oxide, a laminated structure of an aluminum oxide and a zirconium oxide, a laminated structure of a silicon oxide and a titanium oxide, a laminated structure of an aluminum oxide, a silicon oxide, and a zirconium oxide, and a laminated structure of a silicon oxide, a tantalum oxide, and an aluminum oxide, etc. The lamination period and so forth can be suitably adjusted according to the desired reflectivity. The second protective film is preferably formed as a single layer of $SiO_2$ on the exit side, and as a laminated structure of a silicon oxide and a zirconium oxide on the reflecting side.

The second protective films can be formed by utilizing any of the known methods listed above, just as with the above-mentioned first and second films. In particular, to produce an amorphous film, although it will depend on the film formation method, it is preferable to adjust the film formation to a faster rate, to control the atmosphere during film formation to an oxygen atmosphere, for example, or to raise the pressure during film formation, or to combine two or more of these. Also, when the formation is performed under an oxygen atmosphere, it is preferable to introduce only enough oxygen that it will not be absorbed. The specific film formation conditions are preferably such that the film is formed using a silicon target in a sputtering device, the oxygen flow is 3 to 20 sccm, and the RF power is about 300 to 800 W.

It is also preferable for the second protective films to cover the nitride semiconductor layer surface and the second main face of the substrate.

As discussed above, the protective film may be formed with a region that is thinner than the maximum thickness of the protective film at the cavity end face, and in particular in a region in contact with an active layer (or, optionally, a region near this), an optical waveguide region, or when an SCH (separate confinement heterostructure) structure is employed, a region including an active layer and all of part of a guide layer located above and below the active layer. For instance, as shown in FIGS. 11a to 11d, a recess may be formed in the first film and/or the second film in a region near the above-mentioned active layer. It is usually good for this region to be the region below the ridge and the nearby region, that is, a region that includes a region corresponding to the NFP and that has an overall width of no more than about 1.5 times the width of the ridge. Forming a thin-film region corresponding to the shape of the optical waveguide region allows heat dissipation to be increased while still leaving the COD level high, and for this to be accomplished more efficiently.

The thickness of the thin-film region may be less than the maximum film thickness, and is preferably at least about 5% or at least about 1 nm with respect to the maximum film thickness. Alternatively, the thickness of the thin-film region is preferably at least 40% of the maximum film thickness. Even though the film is thinner than in other regions, deterioration due to inadequate strength and so forth can be suppressed, and a stable end-face protective film can be obtained.

For changing the thickness of the protective film, an example is to first form the protective film of the required thickness over the entire surface of the cavity end face, then produce a partial thin film region in the film thickness direction of the protective film by employing a known photolithography method (such as application of resist, pre-bake, light exposure, development and post-bake, etc.) and etching (such as wet etching with an alkali developer, or dry etching with a chlorine-based gas), or by subjecting the thin film region locally to light exposure, heat treatment, or the like. When the protective film is made into a thin film by light exposure or the like, this is preferably performed after a second protective film has been formed over the protective film, in order to prevent the oxidation of the protective film. Here, the protective film in the optical waveguide region may be locally exposed to laser light by driving the element, or a thin film region may be formed by exposure to light from the outside. Known photolithography and etching processes may be utilized to form the protective film in the desired thickness in just the other region of the cavity end face, and then the protective film of the same material may be laminated over the entire surface of the cavity end face to form the thin film region. Also, before the protective film is formed on the cavity end face, a pretreatment or the like may be performed locally so that the quality, thickness, etc., of the resulting protective film can be locally varied. Furthermore, these methods can be combined as desired.

When light exposure, heat treatment, pretreatment, or the like is performed, they are preferably performed at a temperature that will not adversely affect the nitride semiconductor layer, particularly that constituting the active layer or the nearby area, in order to prevent local degradation, modification, etc., of the cavity end face. For example, the temperature is preferably about 900° C. or lower.

In the present invention, the substrate for forming the nitride semiconductor laser may be an insulating substrate or a conductive substrate which can be adopted an opposed electrodes structure. The substrate is, for example, preferably a substrate having an off angle of no more than 10° and greater than 0° to the first main face and/or the second main face. If the conductive substrate is used, a nitride semiconductor substrate is preferable. The thickness of the substrate is at least 50 μm and no more than 10 mm, for example. A commercially available substrate, any of the various known substrates disclosed, for instance, in Japanese Laid-Open Patent Application 2006-24703, or the like may be used.

The nitride semiconductor substrate can be formed by a vapor phase growth method such as MOCVD (Metal Organic Chemical Vapor Deposition), HVPE (Hydride Vapor Phase Epitaxy), MBE (Molecular Beam Epitaxy), or the like, a hydrothermal synthesis method in which crystals are grown in a supercritical fluid, a high pressure method, a flux method, a melt method, or the like.

The nitride semiconductor layer may include a layer having a general formula of $In_xAl_yGa_{1-x-y}N$ ($0 \leq x \leq 1$, $0 \leq y \leq 1$, $0 \leq x+y \leq 1$). In addition to this, it may be used the semiconductor layer which is partly substituted with B as a group III element, or is substituted a part of N as a group V element with P or As. If the first nitride semiconductor layer is n-side semiconductor layer, the second nitride semiconductor layer is p-side semiconductor layer. The n-side nitride semiconductor layer may doped with at least one n-type impurity of IV or VI group elements, such as Si, Ge, Sn, S, O, Ti, Zr, Cd etc. The p-side nitride semiconductor layer may be doped with at least one p-type impurity, such as Mg, Zn, Be, Mn, Ca, Sr etc. The doped concentration is, for example, about $5 \times 10^{16}/cm^3$ to about $1 \times 10^{21}/cm^3$. All of layers in the n-side or p-side nitride semiconductor layers may not necessarily contain n-type or p-type impurity.

The active layer may be a multiple quantum well or single quantum well structure.

The nitride semiconductor layer preferably has a structure which is a SCH (Separate Confinement Heterostructure) wherein an optical waveguide is constituted by providing n-side and p-side optical guide layers above and below the active layer. However, there is no particular restriction on these structures.

Also, the active layer preferably has narrower bandgap energy than the protective film. With the present invention, setting the bandgap energy of the protective film wider than that of the active layer widens the bandgap energy of the cavity end face, or to put it another way, widens the impurity level near the cavity end face, and forms a window structure, and this in turn improves COD level.

In the nitride semiconductor laser element of the present invention may emits laser light with a wavelength of about 220 to 500 nm, it is possible to prevent separation of the protective film and to improve COD level.

There is no particular restriction on a growth method of the nitride semiconductor layer, it can be formed by means of any known method which can grow these nitride semiconductor layers, such as MOVPE (Metal Organic Vapor Phase Epitaxy), MOCVD, HVPE, MBE or the like. In particular, MOCVD is preferable because it allows the nitride semiconductor to be growth with good crystallinity.

A ridge is formed on the surface of the p-side semiconductor layer which is the second nitride semiconductor layer if the first nitride semiconductor layer is n-side semiconductor layer. The ridge functions as an optical waveguide, the width of the ridge may be from 1.0 to 30.0 μm and, if the nitride semiconductor laser is used a light source of a single horizontal mode, preferably from 1.0 to 3.0 μm. The height of the ridge (the etching depth) may be, for example, may be from 0.1 to 2 μm. The extent of optical confinement can be suitably adjusted by adjusting the thickness, material, and so on of the layer that makes up the p-side semiconductor layer. The ridge is preferably set so as to be 200 to 5000 μm of cavity length. The ridge need not be all the same width in the extension direction of the cavity, and its side faces may be vertical or may be tapered with an angle of about 45 to 90°. When the ridge is formed with taper shape, the protective film formed on the cavity end face to the side faces of the ridge is not necessary to have the third face.

The embedded film is usually formed on the surface of the nitride semiconductor layer and to the side faces of the ridge. That is, the embedded film is above the nitride semiconductor layer, is in direct contact with the nitride semiconductor layer and an electrode (discussed below), and is formed in a region other than the region where an electrical connection is made. There are no particular restrictions on the position, size, shape, etc., of the region of connection between the nitride semiconductor layer and the electrode, but this region may, for example, be part of the surface of the nitride semiconductor layer, such as substantially the entire top face of the stripe-like ridge formed on the surface of the nitride semiconductor layer.

The embedded film is generally formed from an insulating material with a smaller refractive index than that of the nitride semiconductor layer. The refractive index can be measured using a polarizing ellipsometer (featuring ellipsometry), more specifically, it is, for example, HS-190 made by J. A. WOOLLAM and other ellipsometers. This embedded film is an insulator of a dielectric film of single layer or multilayer film composed of oxides, nitrides or oxide-nitrides of Zr, Si, V, Nb, Hf, Ta, Al, Ce, In, Sb, Zn, Ti and the like. The embedded film may have monocrystalline, polycrystalline or amorphous. If the embedded film is formed from the side faces of the ridge all the way to the surface of the nitride semiconductor on both sides of the ridge, it will ensure a refractive index difference versus the nitride semiconductor layer, and particularly the p-side semiconductor layer, which allows leakage of light from the active layer to be controlled, allows light to be confined efficiently within the ridge, and also better ensures insulation near the base of the ridge, so the generation of leak current can be avoided.

This embedded film can be formed by any method that is known in this field. For instance, a variety of methods can be used, such as vapor deposition, sputtering, reactive sputtering, ECR plasma sputtering, magnetron sputtering, ion beam assist deposition, ion plating, laser ablation, CVD, spraying, spin coating, dipping, a combination of these two or more methods, a combination of these methods and oxidation treatment (thermal treatment), or the like.

The electrode of the present invention refers to a pair of electrodes electrically connected with p- and n-side nitride semiconductor layers. The p-side electrode is preferably formed over the nitride semiconductor layer and the embedded film. Separation of the embedded film can be prevented by forming the electrode continuously over the embedded film and the nitride semiconductor layer that is the outermost layer. In particular, separation of the embedded film formed on the ridge side faces can be effectively prevented by forming the p-side electrode up to the ridge side faces.

The electrodes may preferably be formed with a single layer or laminated layer of a metal or metal alloy of palladium, platinum, nickel, gold, titanium, tungsten, cupper, silver, zinc, tin, indium, aluminum, iridium, rhodium, ITO (Indium Tin Oxide) or the like. The electrodes are suitable formed in a thickness of, for example, about 50 to about 500 nm depend on the material used. The electrodes may be formed at least on the p-side semiconductor layer and the n-side semiconductor layer or the substrate, respectively, and further may be formed pad electrodes thereon with a conductive layer of a single layer or laminated layer. The p-side and n-side electrodes may be formed on the same side with respect to the substrate. The electrodes are preferably disposed on the cavity end face side and the side face sides so that its end face is located more to the inside than the substrate end face.

A third protective film is preferably formed on the embedded film. This third protective film may be disposed over the embedded film on at least the surface of the nitride semiconductor layer, and preferably also covers the side faces of the nitride semiconductor layer and/or the side faces, surface, etc., of the substrate with or without the embedded film interposed therebetween. The third protective film can be formed from the same materials as those listed as examples for the embedded film. As a result, it is possible to ensure not only insulation reliably but also protection for the exposed side faces, surface, etc., of nitride semiconductor layer.

A p-side pad electrode as a electrode for wire-bonding is preferably formed on the surface of embedded film, the p-side electrode and the third protective film.

The protective films (second protective films) formed on the nitride semiconductor layer surface may be away from, or in contact with, the p-side electrode and the embedding film. Also, the protective films may cover one or more the embedding film, the p-side electrode, and a p-side pad electrode. Preferably, the protective film covers the embedding film and the p-side electrode. This prevents peeling of the embedding film and the p-side electrode, and improves adhesion between the nitride semiconductor layer and the embedding film, between the nitride semiconductor layer and the p-side electrode, and between the embedding film and the p-side electrode. The range of this coverage is preferably about 5 to 30 μm.

Also, a nitride semiconductor laser device is obtained, for example, by mounting a nitride semiconductor laser element to a sub-mount, a stem, or another such support member, and joining a cap member to the support member. Examples of the atmosphere in which the cap member is joined and sealed include a nitrogen atmosphere, an air atmosphere, and an atmosphere containing a rare gas element or oxygen (with a proportional content of 0 to 20%). There are no particular restrictions on the sealing atmosphere when the thin film region is formed after cap sealing, either.

Examples of the nitride semiconductor laser element of the present invention will now be described in detail through reference to the drawings. There are no particular restrictions on the examples of the present invention described below.

Example 1

As shown in FIGS. 1, 3 and 4a, a nitride semiconductor laser element of this Example comprises a first nitride semiconductor layer (n-side, for example) 12, a active layer 13, and a second nitride semiconductor layer (p-side, for example) 14 (on a surface of which is formed a ridge 16), laminated in that order on a first main face (growing face) of a substrate 11 composed of GaN having C-plane (0001) as a first main face, a cavity which has a cavity end faces of mainly M-plane is formed.

With this nitride semiconductor laser element, a protective film 21 and second protective film 22, 23, as shown in FIGS. 2 and 10, are formed on the cavity end face, and also an embedded film 15, a p-side electrode 17, an n-side electrode 20, a third protective film 18, a p-side pad electrode 19 and the like are formed.

The n-side electrode 20 is formed on the N-polarity surface, which is the second main face, of the GaN substrate 11. The n-side electrode 20 is formed in a plan view shape that is substantially similar to the plan view shape of the laser element. The edge of the n-side electrode 20 on the cavity end face side (see, for example, X in FIGS. 4 and 10b) is disposed about 10 μm to the inside on the light emission face side and the light reflecting face side from the end of the laser element (the cavity end face). Also, the edges of the n-side electrode 20 on the side face sides (see, for example, Y in FIGS. 4 and 10b) are disposed about 15 to 30 μm to the inside from the ends (side faces) of the laser element. A p-side electrode 17 is also disposed about 5 μm to the inside from the ends of the laser element on the light emission face side and the light reflecting face side.

As shown in FIGS. 1, 3, and 4a, the protective film 21 has a first region 21A that includes a crystal structure oriented in the same crystal axial direction as the cavity end face, that is, m-axial orientation, a second region 21B (21B1 and 21B2) formed continuously with the first region 21A all the way to the p-side electrode 17 and the surface of the second nitride semiconductor layer 14, and a fourth region 21D (21D1 and 21D2) formed all the way to the n-side electrode 20 surface and the second main face of the GaN substrate 11. Also, a third region 21C and a fifth region 21E that constitute facets having different orientation from the oriented of the above regions are formed between the first region 21A and the second region 21B, and between the first region 21A and the fourth region 21D, and cover the corners of the nitride semiconductor laser element.

The protective film formed on the surface of the second nitride semiconductor layer 14 and the protective film formed on the second main face of the GaN substrate 11 include a crystal structure with c-axial orientation, and are in contact with a second nitride semiconductor layer 12 and the substrate 11, respectively, at a contact surface area of at least 1000 μm². The contact surface area between the electrodes of the protective films formed on the surfaces of the p-side electrode 17 and the n-side electrode 20 is at least 2000 μm², and these films are mainly amorphous.

The protective film 21 is composed of AlN, the maximum thickness over the cavity end face is about 10 nm, the film gradually becomes thinner from the surface of the second nitride semiconductor layer 14 to the p-side electrode 17 and from the second main face of the substrate 11 to the n-side electrode 20 surface, and the thickness at the end of the protective film 21 is about 2 nm.

The protective film 21 has a thin-film region with a thickness of about 5 nm, a recess depth of about 5 nm, a width of about 2.0 μm, and a height of about 70 nm, in the region extending to an active layer 13 and the first nitride semiconductor layer 12 and second nitride semiconductor layer 14 above and below, and in the region extending below and to the left and right of a ridge 16.

The second protective films 22 and 23 formed over the protective films 21A to 21E is composed of amorphous $SiO_2$, and its maximum thickness is about 300 nm.

The second protective film, on the side facing the active layer, protrude corresponding to the region extending to the first nitride semiconductor layer 12 and the second nitride semiconductor layer 14 above and below, and to the region below and to the left and right of the ridge 16, that is, to the thin-film region of the protective film 21A. The second protective film is also a thick-film portion formed by a protrusion on the opposite side to the active layer 13 and having a surface area slightly larger than that of the protrusion on the active layer 13 side. The thickness of the thick-film portion is about 315 nm, for example, and its width is about 3.0 μm and its height about 400 nm.

This nitride semiconductor laser element can be manufactured by the following method.

First, a GaN substrate is prepared. On the C-plane of the GaN substrate, an n-side clad layer composed of $Al_{0.03}Ga_{0.97}N$ doped with Si at $4 \times 10^{18}/cm^3$ (2 μm thick) is grown at a growth temperature of 1160° C. using trimethylaluminum (TMA), trimethyl gallium (TMG) and ammonia ($NH_3$) as the raw material gas with a silane gas for an impurity gas. This n-side clad layer may be composed of a multilayer film (superlattice structure).

Next, the silane gas is stopped, and n-side wave guide layer composed of undoped GaN (0.175 μm thick) is grown at a growth temperature of 1000° C. This wave guide layer may be doped with n-type impurities.

The temperature is set to 900° C., a barrier layer composed of $In_{0.02}Ga_{0.98}N$ doped with Si (14 nm thick) and at same temperature, a well layer composed of undoped $In_{0.07}Ga_{0.93}N$ (7 nm thick) are laminated on the barrier layer. This process is repeated 2 times, finally the barrier layer is formed on the layers to grow an active layer composed of a multi quantum well structure (MQW)) with a total thickness of 56 nm.

A p-side cap layer composed of $p-Al_{0.25}Ga_{0.75}N$ doped with Mg at $1 \times 10^{20}/cm^3$ (10 nm thick) is grown on the active layer using TMG, TMA, $NH_3$, and $Cp_2Mg$ (bis-cyclopentadienyl magnesium) at a growth temperature of 1000° C. This p-side cap layer can be omitted.

Next, $Cp_2Mg$ gas and TMA are stopped, and p-side wave guide layer composed of undoped GaN (0.145 μm thick) is grown at a growth temperature of 1000° C., which has a bandgap energy narrower than the p-side cap layer.

The temperature is set to 1000° C., and a layer composed of undoped $Al_{0.10}Ga_{0.90}N$ (2.5 nm thick) is grown, then a layer composed of GaN doped with Mg (2.5 nm thick) is laminated. These layers are alternately laminated, and this process is repeated to grow a p-side clad layer composed of a super lattice structure with a total thickness of 0.45 μm.

Finally, a p-side contact layer composed of GaN doped with Mg at $1 \times 10^{20}/cm^3$ (15 nm thick) is grown on the p-side clad layer at a growth temperature of 1000° C.

The resulting wafer on which the nitride semiconductor has been grown is taken out of a reaction vessel, and a mask layer composed of $SiO_2$ is formed on the surface of the p-side contact layer (the outermost layer) as a stripe with a length in a direction of the cavity of 800 μm. This portion will be main body of the cavity in the laser element. The cavity length may be preferably set to the range from 200 to 5000 μm.

Next, a $SiO_2$ protective mask is formed as a stripe-shaped mask on the surface of the p-side contact layer, and RIE etching is performed using $SiCl_4$ gas. By these means, a stripe ridge waveguide region is formed.

Then, the sides of the ridge are protected by an insulating layer (i.e., an embedded film) composed of $ZrO_2$.

Next, a p-side electrode composed of Ni (10 nm)/Au (100 nm)/Pt (100 nm) is formed on the surface overlying the p-side contact layer and the insulating layer. Subsequently, ohmic annealing is performed at 600° C., and then a third protective film composed of silicon oxide ($SiO_2$: 0.5 μm thick) is formed by sputtering on the embedded film, and on the sides of the semiconductor layer.

Next, Ni (8 nm)/Pd (200 nm)/Au (800 nm) are formed continuously in this order on the exposed p-side electrode that is not covered by the third protective film, to produce a p-side pad electrode.

And then, the surface of the substrate which is opposite to the side growing the nitride semiconductor layers is polished so as to have a thickness of 80 μm.

An n-side electrode composed of Ti (15 nm)/Pt (200 nm)/Au (300 nm) is formed on the polished surface of the substrate.

Next, recessed grooves are formed on the side of the semiconductor layer of the substrate in a wafer state having the n-side electrode, the p-side electrode and the p-side pad electrode. These grooves is set to depth of 10 μm, the length of 50 μm in the direction parallel to the end faces of the cavity, from the side surface of a chip, and the width of 15 μm in the cavity direction from the cavity end face. The cleaving is performed using the recessed grooves as a cleavage-assist grooves to produce bars in which the cleavage faces (plane (1-100), which is the plane corresponding to the lateral face of a hex-head pillar-shaped crystal, which is to say, the M-plane) are the cavity end faces. The cavity length is set to 800 μm.

A protective film is formed. The protective film comprises a first film composed of AlN and provided from the cavity end face to the nitride semiconductor layer surface and the second main face of the substrate, and a second protective film composed of $SiO_2$ formed over this.

First, the cavity end face is subjected to surface treatment by nitrogen plasma. Then, an aluminum target is used to form a first film composed of AlN and having third and fifth faces in a thickness of 10 nm at an argon flow of 30 sccm, an $N_2$ flow of 10 sccm, a microwave power of 500 W, and RF power of 500 W, and a film formation rate of 2.5 nm/min with an ECR sputtering device. In this process, the angle of the cavity end face facing the target in the sputtering device is set to between 20° and 80°. This allows the protective film to have the desired crystal structure. Also, forming the protective film in this way allows it to have an open box section (vertical cross sectional shape), in which the protective film goes from the nitride semiconductor layer surface to over part of the surface of the p-side electrode, and from the second main face of the GaN substrate to over part of the surface of the n-side electrode. That is, the protective film continuously covers the nitride semiconductor layer surface and the p-side electrode, or the second main face of the GaN substrate and the n-side electrode, from the end of the laser element (cavity end face). More specifically, the protective film extends 25 μm continuously from the ends (side faces) of the laser element to the inside. The thickness in the second and fourth regions here is 4 nm.

Furthermore, an exit-side second protective film composed of $SiO_2$ is formed in a thickness of 290 nm with an ECR sputtering device, using a silicon target, at an oxygen flow of 5 sccm and an RF power of 500 W, over the first film composed of AlN and formed on the cavity end face on this exit side.

On the light reflecting side of the cavity, an AlN film and a $SiO_2$ film may be formed in a thickness of 10 nm and 300 nm, respectively, under the same condition as that of the film of the light exit side, further $SiO_2/ZrO_2$ films are formed in the thickness of 67 nm/44 nm with six cycle repetition.

Finally, cutting is performed into the chip in the direction parallel to the p-side electrode to produce semiconductor laser elements with a width of 200 μm.

After this, voltage is applied to the laser element, and the atmosphere, operating time, operating voltage, operating current, and so forth are adjusted while the so-called core region of the protective film composed of AlN is locally exposed to laser light.

Figure 12:
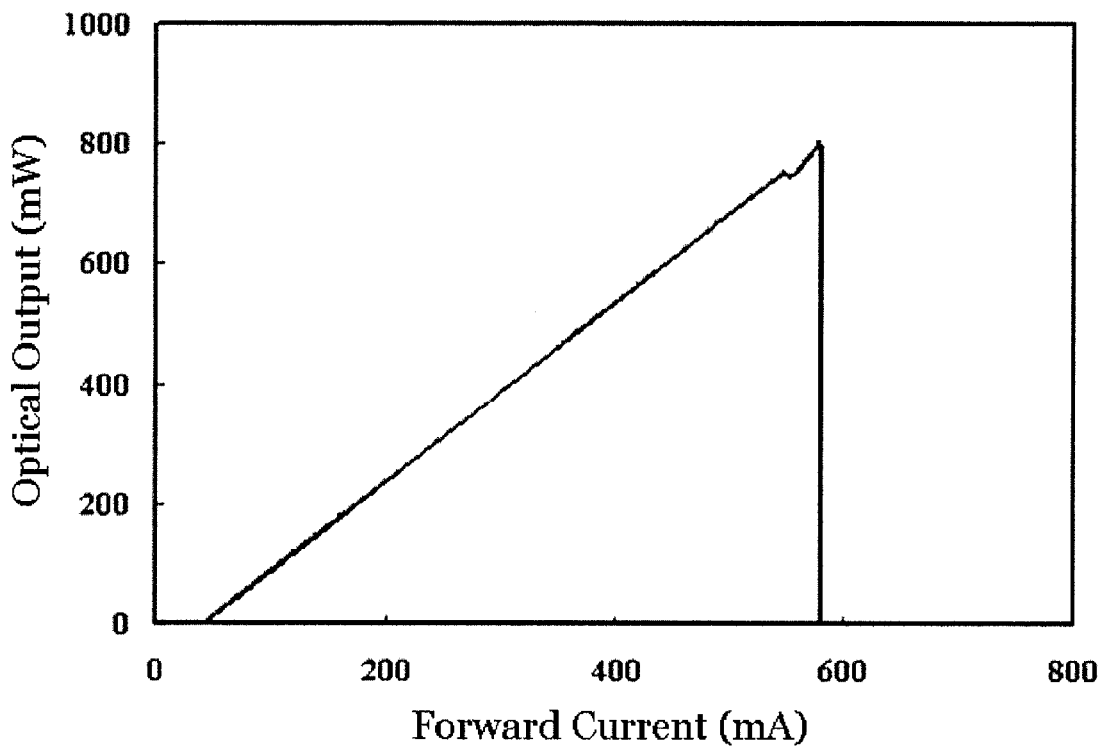
FIG. 12 is a graph showing COD level of the present invention.
Figure 13:
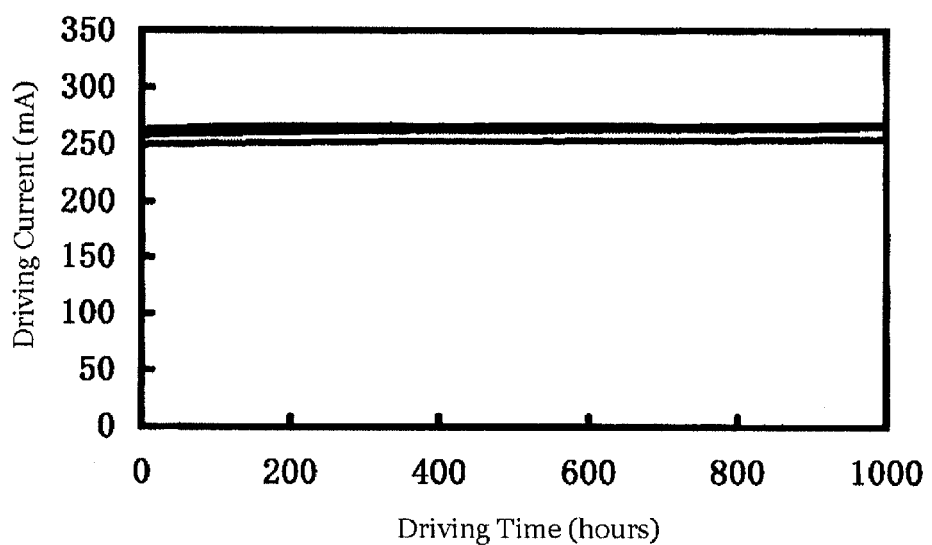
FIG. 13 is a graph showing life property of the laser element of the present invention.

The nitride semiconductor laser element thus obtained was measured for optical output after continuous oscillation at 80° C., an output power of 320 mW pulse (50% duty, 30 nsec cycle), and an oscillation wavelength of 406 nm. These results are given in FIG. 12. The service life characteristics are shown in FIG. 13. Thus, with the present invention, both the output and the service life of a nitride semiconductor laser element could be increased.

For the sake of comparison, a laser element was formed by substantially the same method as for the above-mentioned nitride semiconductor laser element, except that the protective film was formed only of amorphous material, and the optical output after continuous oscillation was measured and evaluated under the same conditions. These results are given with a broken line in FIG. 15. It was confirmed that the COD level was markedly lower than in the example of the present invention.

Also, the protective film peeled away when an amorphous protective film was formed only on the cavity end face.

With the example of the nitride semiconductor laser element of the present invention, however, thus, the protective film is formed so as to continuously come into contact with the cavity end face to the surface of the nitride semiconductor layer, and to continuously come into contact with the second main face of the substrate to the surface of the electrode, and so as to have the first to fifth faces, whose crystal structure are different from that of each surface, with a hexagonal crystal structure, stress can be relieved in the light emitting portion of the nitride semiconductor layer constituting the cavity end face. Thus, no cracks form in the nitride semiconductor and the protective film, adhesion to the cavity end face and the enc face protective film is good, separating is prevented, and this in turn increases the COD level.

Figure 14:
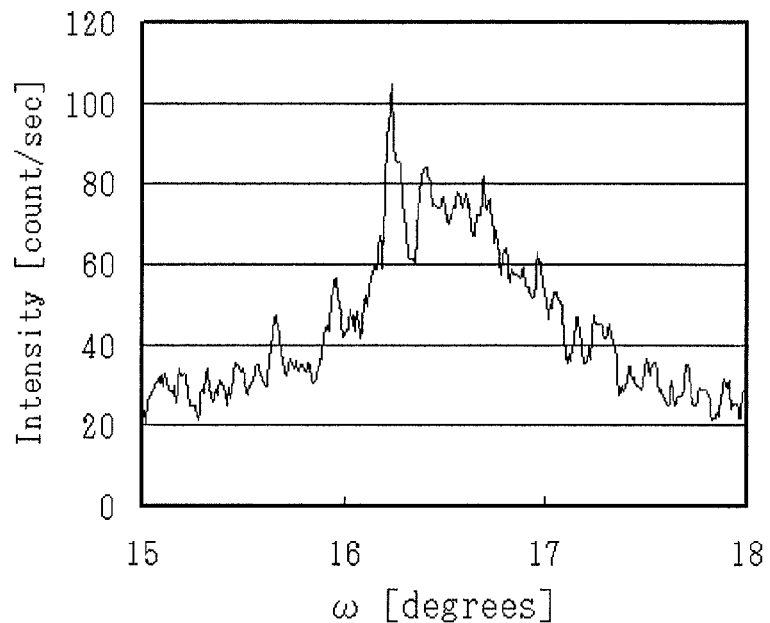
FIG. 14 is a graph showing the orientation of the protective film crystal of the present invention.

To test the protective film of the nitride semiconductor laser element thus obtained, a film was formed by substantially the same method and from the same materials as above on an n-GaN substrate (m-axis orientation: M-plane). More specifically, a first film composed of AlN (10 nm thick) was formed over a pretreated GaN substrate (m-axis orientation: M-plane). The orientation of the film thus obtained was measured using an XRD apparatus (X-rays used: CuK α-line ($\lambda$=0.154 nm), monochrometor: Ge (220), measurement method: ω scan, step width: 0.01 °, scanning speed: 0.4 second/step). The result is shown in FIG. 14. With this measurement device, the vicinity of 16 to 17° corresponded to a peak originating in AlN and indicating m-axis orientation, and the vicinity of near 18° corresponded to a peak originating in AlN and indicating c-axis orientation.

In this FIG. 14, the vicinity of near 180 was not almost seen, and a high peak in the vicinity of 16 to 17° was seen. This means that the film indicate m-axis orientation. The half-value width was 1.0° according to the above measurement method.

Also, a film was formed by substantially the same method and from AlN as above on an n-GaN substrate (c-axis orientation: C-plane) in the thickness of 10 nm, and the film thus obtained was measured the same method as the above. The result was shown that the vicinity of near 18° corresponded to a peak originating in AlN and indicating c-axis orientation was seen, and a peak corresponded to originating in AlN and indicating m-axis orientation was not almost seen This means that the film indicate c-axis orientation.

Further, an AlN film formed on the surface of a metal was measured the same method as the above. The vicinity of a specific angle corresponded to a peak and indicating orientation is not almost seen. This means that the second protective film indicate amorphous.

Example 2

In this example, a protective film composed of AlN is formed in a thickness of 32 nm. The thickness of the second and fourth regions here is 10 nm.

Specifically, a laser element is produced in the same manner as in Example 1, except that an ECR sputtering device is used, the argon flow is 30 sccm, the $N_2$ flow of 15 sccm, the microwave power is 500 W, the RF power is 500 W, and the film formation rate is 2 nm/min.

As shown in FIG. 3, the laser element thus obtained has an AlN film having a third face and a fifth face, and the same effects are obtained as in Example 1.

Example 3

In this example, a protective film composed of AlN is formed in a thickness of 32 nm. The thickness of the second and fourth regions here is 16 nm.

Specifically, a laser element is produced in the same manner as in Example 1, except that an ECR sputtering device is used, the argon flow is 30 sccm, the $N_2$ flow of 10 sccm, the microwave power is 500 W, the RF power is 250 W, and the film formation rate is 1 nm/min.

As shown in FIG. 7c, the laser element thus obtained has an AlN film having four third faces and four fifth faces, and the same effects are obtained as in Example 1.

Example 4

In this example, a protective film composed of AlN is formed in a thickness of 100 nm. The thickness of the second and fourth regions here is 40 nm.

Specifically, a laser element is produced in the same manner as in Example 1, except that an ECR sputtering device is used, the argon flow is 30 sccm, the $N_2$ flow of 15 sccm, the microwave power is 500 W, the RF power is 500 W, and the film formation rate is 2 nm/min.

As shown in FIG. 7c, the laser element thus obtained has an AlN film having four third face and four fifth face, the third films 21c1 and 21c2 are larger than that of Example 3, and the same effects are obtained as in Example 1.

Examples 5 to 12

In these examples, laser elements were produced in the same manner as in Example 1, except that the thickness was changed for the protective film composed of AlN and for the second protective film composed of $SiO_2$. The $B_1$ as shown in FIG. 4b is about 10 μm on the light emit side and the light reflecting side. The C is about 30 to 40 μm.

The laser element thus obtained had the protective film and the second protective film composition and film thickness shown in the following table. The resulting protective film was confirmed that it includes a structure of m-axis orientation in a region which come into contact with the cavity end face, and a structure of c-axis orientation in a region which come into contact with the semiconductor layer and the back side of the substrate, and a structure of amorphous in a region which come into contact with the electrode.

TABLE 1

| | Protective Film | | | Second Protective Film |
|---|---|---|---|---|
| | 21A | 21B1(21D1) | 21B2(21D2) | 22 |
| Ex. 5 | AlN: 10 nm | 4 nm | 4 nm | $SiO_2$: 160 nm |
| Ex. 6 | AlN: 10 nm | 4 nm | 4 nm | $SiO_2$: 300 nm |
| Ex. 7 | AlN: 10 nm | 4 nm | 4 nm | $SiO_2$: 20 nm |
| Ex. 8 | AlN: 32 nm | 12 nm | 12 nm | $SiO_2$: 110 nm |
| Ex. 9 | AlN: 120 nm | 50 nm | 48 nm | $SiO_2$: 300 nm |
| Ex. 10 | AlN: 32 nm | 10 nm | 10 nm | $SiO_2$: 260 nm |
| Ex. 11 | AlN: 5 nm | 2 nm | 2 nm | $SiO_2$: 160 nm |
| Ex. 12 | AlN: 5 nm | 2 nm | 2 nm | $SiO_2$: 20 nm |

Figure 15:
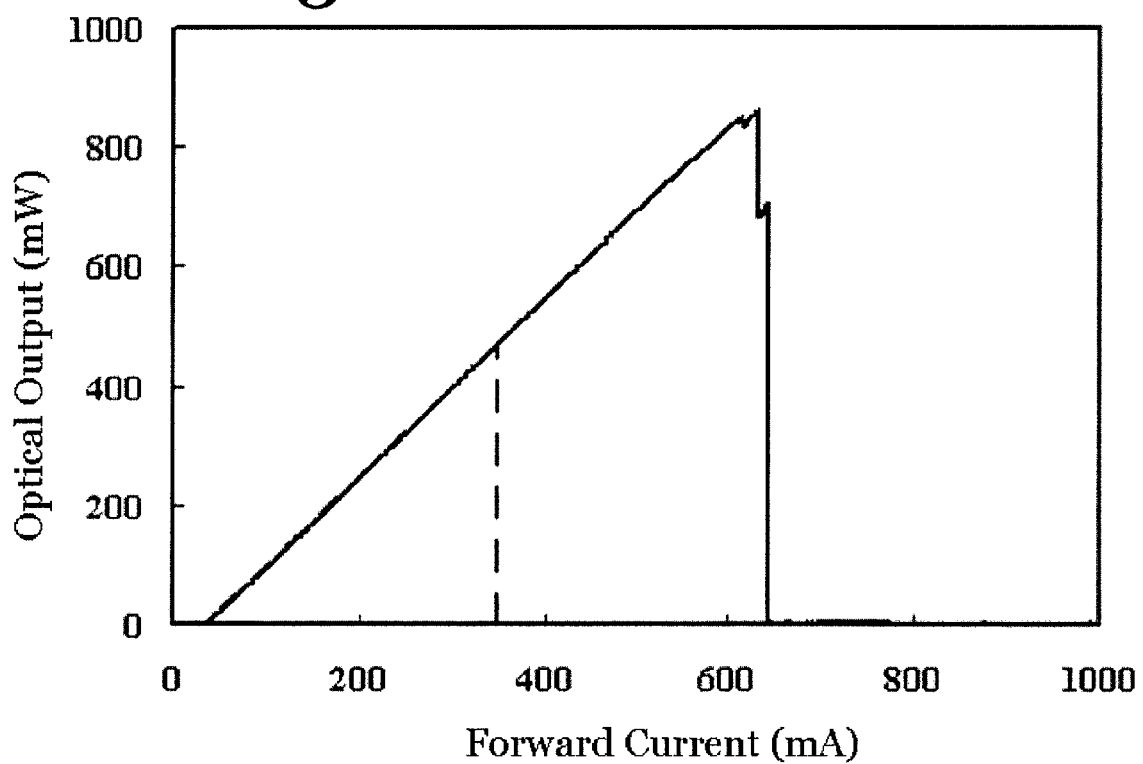
FIG. 15 is a graph showing COD level of the present invention.

These laser elements were evaluated in the same manner as in Example 1, some of the results of which are given in FIG. 15. The solid line in FIG. 15 shows the results for Example 6, and the dashed line shows those for comparative example showing in Example 1.

In FIG. 15, it can be seen that the COD level was good in both Example 6. Also, although not shown, the COD level increased in Examples 5, 7 to 12 in the same manner as in Example 1, and service life characteristics were found to be good.

Example 13

In this example, as shown in FIG. 8, the protective film 21 was composed of AlN, at the cavity end face the maximum thickness was about 10 nm, with the thickness gradually decreasing from the second main face of the substrate 11 to the surface of the n-side electrode 20, and at the ends of the protective films 21B and 21D, a film composed of GaN was further formed as a second film 21' over the protective films 21A to 21E, where the thickness was about 2 nm. Other than this, the constitution was substantially the same as in Example 1.

At locations corresponding to the protective films 21A to 21E, the second film 21' had the same crystal structure as the protective films 21A to 21E, that is, at the location corresponding to the protective film 21A, a crystal structure with m-axial orientation was included, at the locations corresponding to the protective films 21B1 and 21D1 a crystal structure with c-axial orientation was included, and at locations corresponding to the protective films 21B2 and 21D2 the material was amorphous.

The nitride semiconductor laser element of this example, adhesion of the protective film improves, the COD level increases, and the life property is good the same as in Example 1.

Example 14

Figure 16:
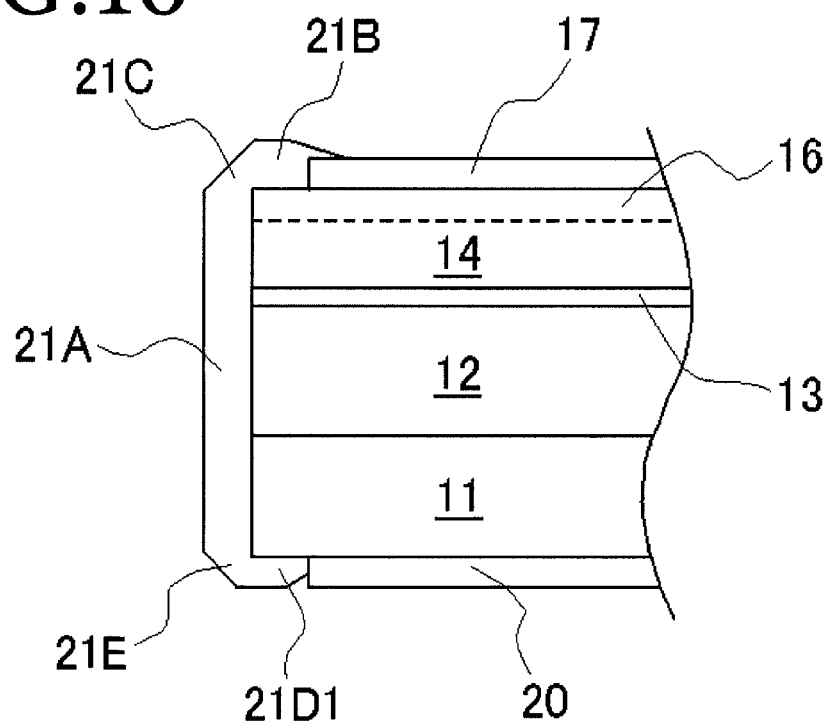
FIG. 16 is a simplified lateral side vertical cross section illustrating the structure of the still another protective film of the present invention.

In this example, as shown in FIG. 16, the protective film 21 was composed of AlN, at the cavity end face the maximum thickness was about 10 nm, with the thickness gradually decreasing on the second main face of the substrate 11, and at the ends of the protective film 21D, the protective film 21 A to 21C and 21 D1 and 21E, where the thickness was about 4 nm film, was further formed. Other than this, the constitution was substantially the same as in Example 1.

That is, in this example, the protective film had a shape that did not reach the surface of the n-side electrode 20, but the contact surface area between the protective film 21D1 and the second main face of the substrate 11 was increased to at least 5000 μm². Furthermore, as long as the proper contact surface area with the second main face of the substrate 11 is ensured, the protective film 21D1 may be in contact at its end with the n-side electrode 20, or may be away from the n-side electrode 20.

The nitride semiconductor laser element of this example, adhesion of the protective film improves, the COD level increases, and the life property is good the same as in Example 1.

Example 15

Figure 17:
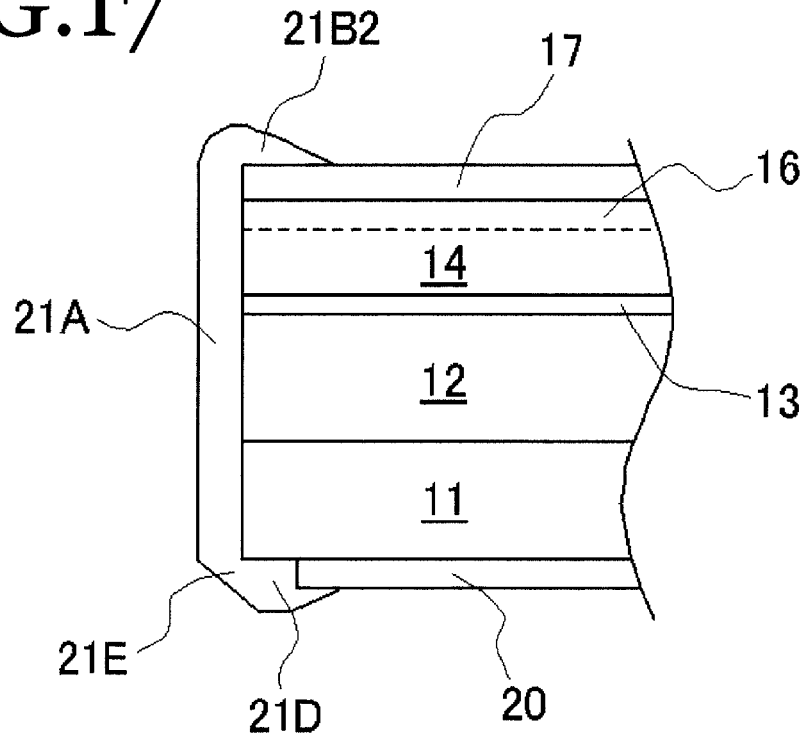
FIG. 17 is a simplified lateral side vertical cross section illustrating the structure of the still another protective film of the present invention.

In this example, as shown in FIG. 17, the end face of the p-side electrode 17 is formed in the same plane as the cavity end face, and therefore the protective film on the p-side electrode 17 side is not in contact with the surface of the ridge 16. Other than this, the constitution was substantially the same as in Example 1.

The nitride semiconductor laser element of this example, adhesion of the protective film improves, the COD level increases, and the life property is good the same as in Example 1.

Example 16

In this example, a first nitride semiconductor layer 12 (such as n side), an active layer 13, and a second nitride semiconductor layer 14 (such as p side) on whose surface is formed the ridge 16 were laminated in that order on the gallium face (the first main face) of the substrate 11 composed of GaN, in which the first main face was the M-plane (1-100). A cavity was formed in which the C-plane was mainly the cavity end face. The protective film 21A formed on the cavity end face included a crystal structure with c-axial orientation, the protective films 21B1 and 21D1 included a crystal structure with m-axial orientation, and the protective films 2112 and 21D2 were amorphous. Other than this, the constitution was substantially the same as in Example 1.

The nitride semiconductor laser element of this example, adhesion of the protective film improves, the COD level increases, and the life property is good the same as in Example 1.

The present invention can be applied to semiconductor elements which has a protective film on the semiconductor crystal, especially, it is suitable for semiconductor elements having the protective film which is provided on not only the main face of the semiconductor crystal but also the side face consecutive in the main face. More specifically, the present invention can be applied to a wide range of nitride semiconductor elements with which the protective film needs to adhere well to the semiconductor layer, such as in use as light emitting elements (e.g., LD, LED, super luminescence diode, etc.), solar cells, light-receptive elements (e.g., light sensor, etc.), electric devices (e.g., transistor, power device, etc.) and the like. In particular, it is useful as nitride semiconductor elements in optical disk applications, optical communications systems, printers, optical exposure applications, and various devices for measurement, excitation light source for bio-specific applications and the like.

This application claims priority to Japanese Patent Application Nos. 2007-039271, 2007-050554 and 2007-060594. The entire disclosure of Japanese Patent Application Nos. 2007-039271, 2007-050554 and 2007-060594 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention is provided for illustration only, and not for the purpose of limiting the invention as defined by the appended claims and their equivalents.

What is claimed is:

1. A nitride semiconductor laser element, comprising:
a nitride semiconductor structure having a first nitride semiconductor layer, a second nitride semiconductor layer, and an active layer provided between the first and second nitride semiconductor layers;
a cavity end face provided to the nitride semiconductor structure; and
a protective film having a hexagonal crystal structure, and having a first region provided on a first crystal surface of the nitride semiconductor structure in the cavity end face and a second region provided on a second crystal surface in the surface of at least one of the first and second nitride semiconductor layer, the protective film being a nitride film,
the first and second regions of the protective film have crystal structures oriented in the same axial direction as that of the respective first and second crystal surfaces.

2. The laser element according to claim 1, wherein
the second region of the protective film is provided on the second crystal surface with one axial orientation in the surface of the second nitride semiconductor layer.

3. The laser element according to claim 2, wherein
the second region of the protective film includes a crystal structure with c-axial <0001> orientation.

4. The laser element according to claim 2, wherein
the first region of the protective film is provided on the first crystal surface with one axial orientation in the side surface of the second nitride semiconductor layer.

5. The laser element according to claim 4, wherein
the first region of the protective film includes a crystal structure with m-axial <1-100> orientation.

6. The laser element according to claim 4, wherein
the protective film comprises a first face which is the surface of the first region, a second face which is the surface of the second region, and a third face which is disposed between the first and second faces and covers a corner of the second nitride semiconductor layer.

7. The laser element according to claim 6, wherein
the third face has at least a crystal facet of the protective film.

8. The laser element according to claim 4, wherein
a ridge is provided in the surface of the second nitride semiconductor layer, and the protective film in the second region is covered on the ridge.

9. The laser element according to claim 8, wherein
an electrode is disposed away from the cavity end face on the surface of the ridge, the protective film in the second region is extended from a surface portion exposed from the electrode to the electrode on the surface of the ridge.

10. The laser element according to claim 9, wherein
a part of the protective film overlying the electrode contains an amorphous.

11. The laser element according to claim 1, wherein
the nitride semiconductor layer structure includes a conductive substrate having a first main face on which the first and second nitride semiconductor layers are provided, and the second region of the protective film is provided on a second main face of the conductive substrate.

12. The laser element according to claim 11, wherein the second region of the protective film includes a crystal structure with c-axial <0001> orientation.

13. The laser element according to claim 11, wherein an electrode is disposed away from the cavity end face on the second main face, the protective film is extended from a surface portion exposed from the electrode to the electrode on the second main face.

14. The laser element according to claim 11, wherein the conductive substrate is a nitride semiconductor substrate.

15. The laser element according to claim 4, wherein the first nitride semiconductor layer is n-side nitride semiconductor layer, and the second nitride semiconductor layer is p-side nitride semiconductor layer.

16. The laser element according to claim 1, wherein the protective film is composed of at least one of AlN and AlGaN.

17. The laser element according to claim 1, wherein the protective film has a thicker in the first region than that of in the second region.

18. The laser element according to claim 1, wherein the cavity end face is selected from the group consisting of M-plane (1-100), A-plane (11-20), C-plane (0001), and R-plane (1-102).

19. The laser element according to claim 1, wherein a second protective film is covered on the protective film in the first and second regions.

20. A nitride semiconductor laser element, comprising:
a nitride semiconductor structure having a first nitride semiconductor layer, a second nitride semiconductor layer, and an active layer provided between the first and second nitride semiconductor layers;
a cavity end face provided to the nitride semiconductor structure; and
a protective film having a hexagonal crystal structure, and having a first region provided on a first crystal surface of the nitride semiconductor structure in the cavity end face and a second region provided on a second crystal surface in the surface of at least one of the first and second nitride semiconductor layer, the protective film being a nitride film,
the first and second regions of the protective film have crystal structures oriented in the same axial direction as that of the respective first and second crystal surfaces,
the protective film comprises a first face which is the surface of the first region, a second face which is the surface of the second region, and a third face which is located between the first and second faces and covers a corner of the nitride semiconductor structure.

21. The laser element according to claim 20, wherein the second region of the protective film includes a crystal structure with c-axial <0001> orientation.

22. The laser element according to claim 20, wherein the first region of the protective film includes a crystal structure with m-axial <1-100> orientation.

23. The laser element according to claim 20, wherein the protective film is composed of at least one of AlN and AlGaN.

24. The laser element according to claim 20, wherein the cavity end face is selected from the group consisting of M-plane (1-100), A-plane (11-20), C-plane (0001), and R-plane (1-102).

* * * * *